United States Patent
Takeuchi

[19]

[11] Patent Number: 6,134,157
[45] Date of Patent: Oct. 17, 2000

[54] NONVOLATILE SEMICONDUCTOR MEMORY DEVICE CAPABLE OF PREVENTING DATA FROM BEING WRITTEN IN ERROR

[75] Inventor: Ken Takeuchi, Tokyo, Japan

[73] Assignee: Kabushiki Kaisha Toshiba, Kawasaki, Japan

[21] Appl. No.: 09/017,801

[22] Filed: Feb. 3, 1998

[30] Foreign Application Priority Data

Feb. 3, 1997 [JP] Japan ..................................... 9-020468

[51] Int. Cl.[7] .................................................. G11C 13/00
[52] U.S. Cl. ........................................................ 365/200
[58] Field of Search .............................. 365/189.01, 200, 365/228, 229

[56] References Cited

U.S. PATENT DOCUMENTS 4,193,128  3/1980  Brewer ..................................... 365/228

Primary Examiner—Terrell W. Fears
Attorney, Agent, or Firm—Banner & Witcoff, Ltd.

[57] ABSTRACT

A memory cell array includes a plurality of memory cells connected in series, and each of the memory cells is constituted of an EEPROM. A bit line is connected to one end of the memory cell array, and a source line is connected to the other end thereof. A source line bias circuit is connected to the source line. The source line bias circuit supplies a voltage, which is higher than a power supply voltage and lower than an erase voltage in a data write mode, to the source line to precharge the voltage of channels of the memory cells higher than the power supply voltage. After that, a voltage is applied to the control gates of the memory cells to boost the precharged voltage further by capacitance coupling of the channels and control gates. It is thus possible to prevent data from being erroneously written to a memory cell for writing "1" data.

80 Claims, 27 Drawing Sheets

NONVOLATILE SEMICONDUCTOR MEMORY DEVICE CAPABLE OF PREVENTING DATA FROM BEING WRITTEN IN ERROR

BACKGROUND OF THE INVENTION

The present invention relates to an electrically erasable programmable nonvolatile semiconductor memory device such as an EEPROM.

Recently a NAND cell type EEPROM has been proposed as one of the available electrically erasable programmable nonvolatile semiconductor memory devices. In this EEPROM, adjacent source and drain regions of a plurality of memory cells are connected in series, and these series-connected regions are connected to a bit line as one unit. Each of the memory cells has an n-channel MOSFET structure wherein a floating gate serve as charge storage layers and a control gate, which are formed one on another.

FIGS. 26A and 26B are a plan view and an equivalent circuit diagram illustrating one of NAND cells of a memory cell array. FIG. 27A is a cross-sectional view taken along line 27a—27a of FIG. 26A, and FIG. 27B is a cross-sectional view taken along line 27b—27b of FIG. 26A.

The memory cell array including the plural NAND cells is formed on a p-type silicon substrate (or p-type well) 71 surrounded with an element isolation oxide film 72. In this array, each of the NAND cells is constituted of eight memory cells M1 to M8 connected in series. In each of the memory cells, a floating gate 74 ($74_1, 74_2, \ldots 74_8$) is formed on the substrate 71 with a gate insulation film 73 interposed therebetween. Adjacent n-type diffusion layers 79 of the memory cells, which serve as source and drain regions, are connected in series.

First select gates $74_9$ and $76_9$ and second select gates $74_{10}$ and $76_{10}$ are provided on the drain and source sides of the NAND cell, respectively. The first select gates $74_9$ and $76_9$ and second select gates $74_{10}$ and $76_{10}$ are formed at the same time when the floating gate 74 and control gate 76 ($76_1$ to $76_8$) are done. The first select gates $74_9$ and $76_9$ are connected to each other at a desired portion (not shown), as are the second select gates $74_{10}$ and $76_{10}$. The substrate on which the elements are formed is covered with a CVD oxide film 77, and a bit line 78 is provided thereon. The control gate 76 ($76_1$ to $76_8$=$CG_1$ to $CG_8$) serves as a word line, and the select gates $74_9$ and $76_9$, and $74_{10}$ and $76_{10}$ ($SG_1$, $SG_2$) are arranged in the row direction and each serves as a select gate line.

FIG. 28 illustrates an equivalent circuit of the memory cell array having NAND cells arranged in matrix. In this circuit, one source line is provided every 64 bit lines and connected through a contact to a reference potential wiring formed of aluminum, polysilicon or the like. The reference potential wiring is connected to a peripheral circuit. The control gates and the first and second select gates of the memory cell are arranged continuously in the row direction. Usually a group of memory cells to which the control gates are connected in common, is called one page, and a group of pages arranged between paired select gates on the drain (first select gate) and source (second select gate) sides is called one NAND block or simply one block. One page is constituted of, e.g., 256-byte (256×8) memory cells. Data is written to the memory cells of one page almost at once. One block is constituted of, e.g., 2048-byte (2048×8) memory cells. Data is erased from the memory cells of one block almost at once.

The NAND cell type EEPROM performs the following operation. In one NAND cell, data is written first to a memory cell located far away from the bit line. A voltage of 0V or a power supply voltage Vcc is applied to the bit line in accordance with the data. To write data "0" is called "0" write, and to write data "1" corresponding to Vcc is called "1" write. The power supply voltage Vcc is applied to a select gate for connecting the NAND cell to the bit line, and the ground potential 0V is applied to a select gate for connecting the NAND cell to the source line. At this time, 0V is applied from the bit line to a channel of the "0" write cell. Since, in the "1" write, the select gate connected to the bit line is turned off, the potential of a channel of the "1" write memory cell is Vcc-Vthsg (Vthsg is a threshold voltage of the select gate), resulting in a floating state.

After that, a boosted write voltage vpp (=about 20V) is applied to the control gate of a selected memory cell, and an intermediate potential Vpass (=about 10V) is applied to those of the other non-selected memory cells. Since the potential of the channel of the selected memory cell is at 0V when data is "0," a high voltage is applied between the channel and floating gate of the selected memory cell, with the result that electrons are injected from the channel into the floating gate by F-N tunneling and the threshold voltage of the selected memory cell is moved in the positive direction. When data is "1," the potential of the channel in the floating state is set to about 6V by capacitance coupling of the channel and the control gate, so that no electrons are injected from the channel into the floating gate.

The data stored in memory cells of each block are erased almost at the same time. In other words, for example, when a memory cell is formed within a p-type well provided in an n-type substrate, all the control and select gates of a block to be erased are set to 0V, and a boosted voltage VppE (=about 20V) to the p-type well and n-type substrate, with the result that electrons are emitted from the floating gate to the well and the threshold voltage of the memory cell is moved in the negative direction and, at this time, VppE is applied to the control and select gates of blocks which is not to be erased.

In the data readout operation, the bit lines are precharged and then set in a floating state. In this state, the control gate of a selected memory cell is set to 0V, the control and select gates of the other memory cells are each set to, e.g., 4.5V, and the source line is set to 0V to detect whether a current flows through the selected memory cells by an amount of variation in potential of the bit lines. More specifically, when data "0" (Vth>0) is written to the memory cell, the memory cell is turned off and thus the bit lines remain at the precharge potential. On the other hand, when data "1" (Vth<0) is written to the memory cell, the memory cell is turned on and thus the bit lines are dropped by ΔV from the precharge potential. If the variations in the bit line potentials are sensed by a sense amplifier, data of the memory cell is read out.

Conventionally, when data "1" is written, the channel potential is set to an intermediate one by capacitance coupling of the control gate and channel. However, for example, when the capacitance of a diffusion layer ($n^+$ region in FIG. 27) of a memory cell is large, the voltage of the channel is increased only by about 3V even though a voltage of 10V is applied to the control gate. Consequently, when a high voltage for writing data is applied to a selected control gate, a difference in potential between the channel and control gate of a memory cell connected to the control gate to write data "1" is widened, and data is written to the memory cell in error. It can thus be thought to apply a voltage of 10V or higher to a non-selected control gate. However, when the voltage to be applied to the non-selected control gate is simply heightened, the reliability of a memory cell, which is connected to the non-selected control gate and whose channel is set at a potential of 0V, is influenced adversely. Thus, the potential of the non-selected control gate cannot be increased.

BRIEF SUMMARY OF THE INVENTION

An object of the present invention is to provide a nonvolatile semiconductor memory device which is easy to adequately increase a write inhibit voltage after capacitance coupling of a channel and a word line of a memory cell by increasing a precharge potential before the channel is set in a floating state and which is capable of broadening an erroneous writing margin thereby to improve in reliability.

To attain the above object, according to a first aspect of the present invention, there is provided a nonvolatile semiconductor memory device comprising: a memory cell section including at least one nonvolatile memory cell; and a control circuit for applying a write non-select potential from one end of the memory cell section to the memory cell section, and applying write data from another end of the memory cell section thereby to set a desired write state in a selected nonvolatile memory cell of the memory cell section.

According to a second aspect of the present invention, there is provided a nonvolatile semiconductor memory device comprising: a memory cell section including at least one nonvolatile memory cell; a first common signal line connected to one end of the memory cell section; a second common signal line connected to another end of the memory cell section; a first voltage apply circuit coupled to the second common signal line; and a control circuit for setting the memory cell section in a write non-select state by applying a write non-select potential from the first voltage apply circuit to the memory cell section through the second common signal line, and applying a predetermined voltage from the first common signal line to the memory cell section thereby to set a desired write state in the memory cell section.

According to a third aspect of the present invention, there is provided a nonvolatile semiconductor memory device comprising: a memory cell section including at least one nonvolatile memory cell; a first common signal line connected to one end of the memory cell section; a second common signal line connected to another end of the memory cell section; a first select gate arranged between the first common signal line and the memory cell section; a second select gate arranged between the second common signal line and the memory cell section; a first voltage apply circuit coupled to the second common signal line; and a control circuit for turning off the first select gate and turning on the second select gate to set the memory cell section in a write non-select state by applying a write non-select potential from the first voltage apply circuit to the memory cell section through the second common signal line, and turning off the second select gate to set a desired write state in the memory cell section based on write data transferred to the first common signal line.

According to a fourth aspect of the present invention, there is provided a nonvolatile semiconductor memory device comprising: a memory cell section including at least one nonvolatile memory cell; a first common signal line connected to one end of the memory cell section; a second common signal line connected to another end of the memory cell section; a first voltage apply circuit coupled to the second common signal line, for applying a write non-select potential to the second common signal line; a first select gate for connecting the one end of the memory cell section to the first common signal line; a second select gate for connecting the another end of the memory cell section to the second common signal line; a second voltage apply circuit for applying a predetermined voltage to the first select gate, the second select gate, and a control gate of the nonvolatile memory cell; and a control circuit for, in a data write mode, causing the second voltage apply circuit to apply a ground potential to the first select gate, to apply a voltage, which is higher than the write non-select potential at least by a threshold voltage of the nonvolatile memory cell, to the control gate of the nonvolatile memory cell, to apply a voltage, which is higher than the write non-select potential at least by a threshold voltage of the second select gate, to the second select gate, then, to apply the ground potential to the second select gate to set the memory cell section in a write non-select state, and then to apply a first select gate voltage to the first select gate to set a desired write state in the memory cell section.

According to a fifth aspect of the present invention, there is provided a nonvolatile semiconductor memory device comprising: a memory cell section including at least one nonvolatile memory cell; a first common signal line connected to one end of the memory cell section; a second common signal line connected to another end of the memory cell section; a first select gate for connecting the one end of the memory cell section to the first common signal line; a second select gate for connecting the other end of the memory cell section to the second common signal line; a first voltage apply circuit connected to the second common signal line and the second select gate, for applying a write non-select potential to the second common signal line and the second select gate; a second voltage apply circuit for applying a predetermined voltage to the first select gate and a control gate of the nonvolatile memory cell; and a control circuit for, in a data write mode, causing the second voltage apply circuit to apply a ground potential to the first select gate and the control gate of the nonvolatile memory cell, to apply the write non-select potential to the second select gate and the second common signal line to set the memory cell section in a write non-select state, to apply the ground potential to the second select gate, and then to apply a first select gate voltage to the first select gate to set a desired write state in the memory cell section.

In the nonvolatile semiconductor device having the above constitution, the precharge potential can be set high before the channel of a memory cell is rendered in a floating state. Since, therefore, the write inhibit potential after capacitance coupling of the channel and word line can be increased further, an erroneous writing margin can be broadened to improve the reliability of the device.

Furthermore, since a write non-select potential is applied from the side opposite to that supplied with data of a memory cell section, the number of circuits can be prevented from increasing and so can the size of a chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will now be described with reference to the accompanying drawings.

Figure 1:
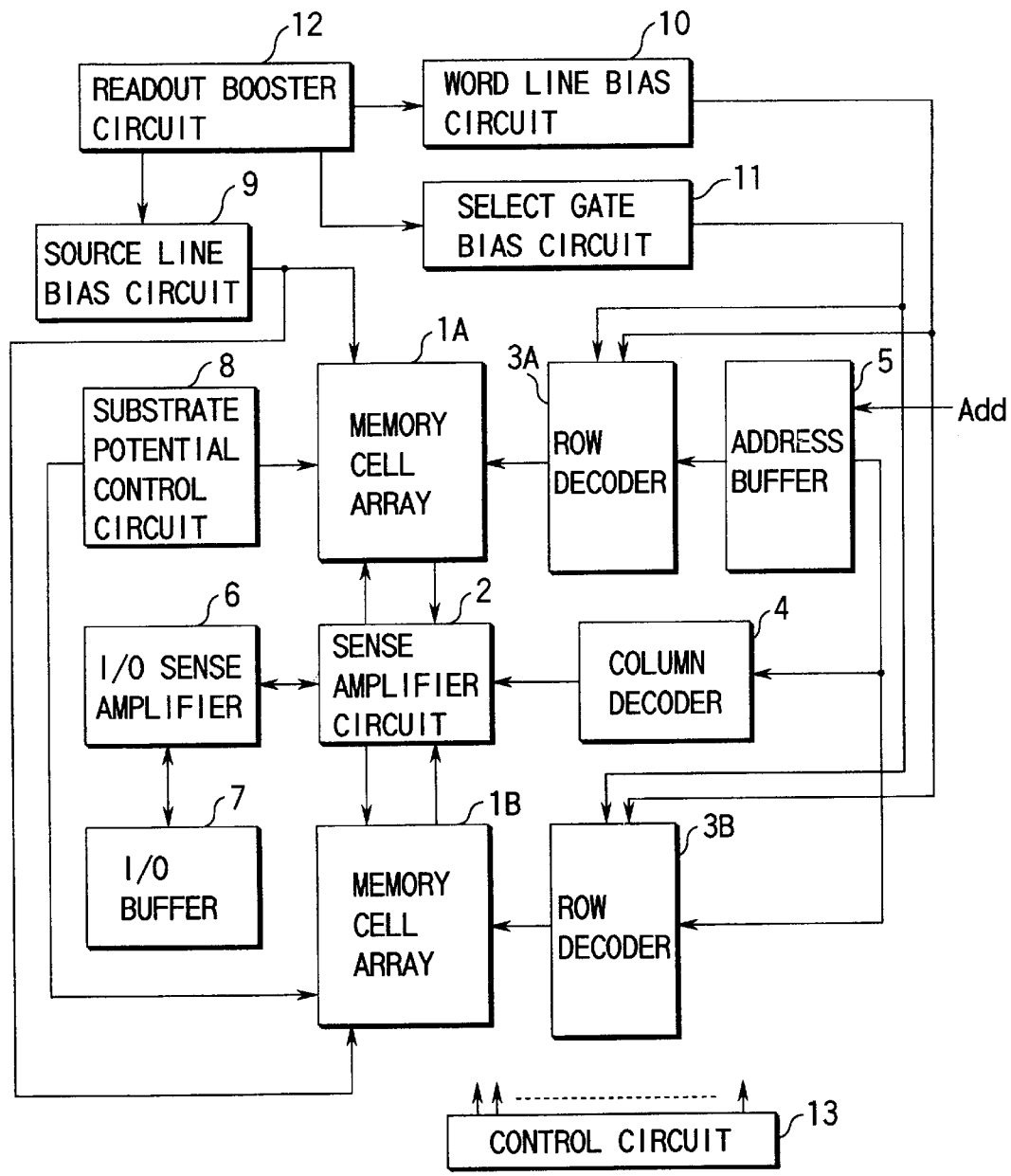
FIG. 1 is a block diagram of a NAND type EEPROM of the present invention.

FIG. 1 is a block diagram illustrating the layout of a NAND cell type EEPROM. Memory cell arrays 1A and 1B each have NAND cells arranged in row and column directions. Since these arrays 1A and 1B are of an open bit line type, a sense amplifier circuit 2 including a latch means for writing and reading data is provided between the memory cell arrays 1A and 1B. The circuit 2 is connected to the bit lines of the arrays 1A and 1B. A column decoder 4 is connected to the sense amplifier circuit 2, and row decoders 3A and 3B are connected to the memory cell arrays 1A and 1B, respectively.

An address buffer 5, which holds an address signal Add, is connected to the column decoder 4 and row decoders 3A and 3B. The column decoder 4 selects a bit line in response to an address signal supplied from the address buffer 5, and the row decoders 3A and 3B select a word line and a select gate, respectively, in response to an address signal supplied from the address buffer 5.

An I/O sense amplifier 6 for amplifying I/O data is connected to the sense amplifier circuit 2, and an I/O buffer 7 for inputting/outputting data to/from a device outside a chip, is connected to the I/O sense amplifier 6. Moreover, a substrate potential control circuit 8 for controlling a substrate potential and a source line bias circuit 9 for applying a potential to a source line (described later) are connected to the memory cell arrays 1A and 1B. The circuit 9 grounds the source line when data is read out and verified and sets it to a write non-select potential when data is written.

A word line bias circuit 10 for applying a potential to the word lines and a select gate bias circuit 11 for applying a potential to a selected gate are connected to the row decoders 3A and 3B. A readout booster circuit 12 is connected to the word line bias circuit 10, select gate bias circuit 11, and source line bias circuit 9, and generates a boost voltage of, e.g., 4.5V or 6V, which is higher than power supply voltage Vcc to be applied to the select and control gates when data is read out and verified. In other words, the boost voltage is applied to the word line bias circuit 10 and select gate bias circuit 11, i.e., a first voltage apply circuit when data is read out and verified. On the other hand, when data is written, a boost voltage output from the readout booster circuit 12 is applied to the source line bias circuit 9 serving as a second voltage apply circuit. A control circuit 13 controls the source line bias circuit 9, select gate bias circuit 11, readout booster circuit 12, substrate potential control circuit 8, etc. to perform write, read, verify and erase operations.

Figure 2:
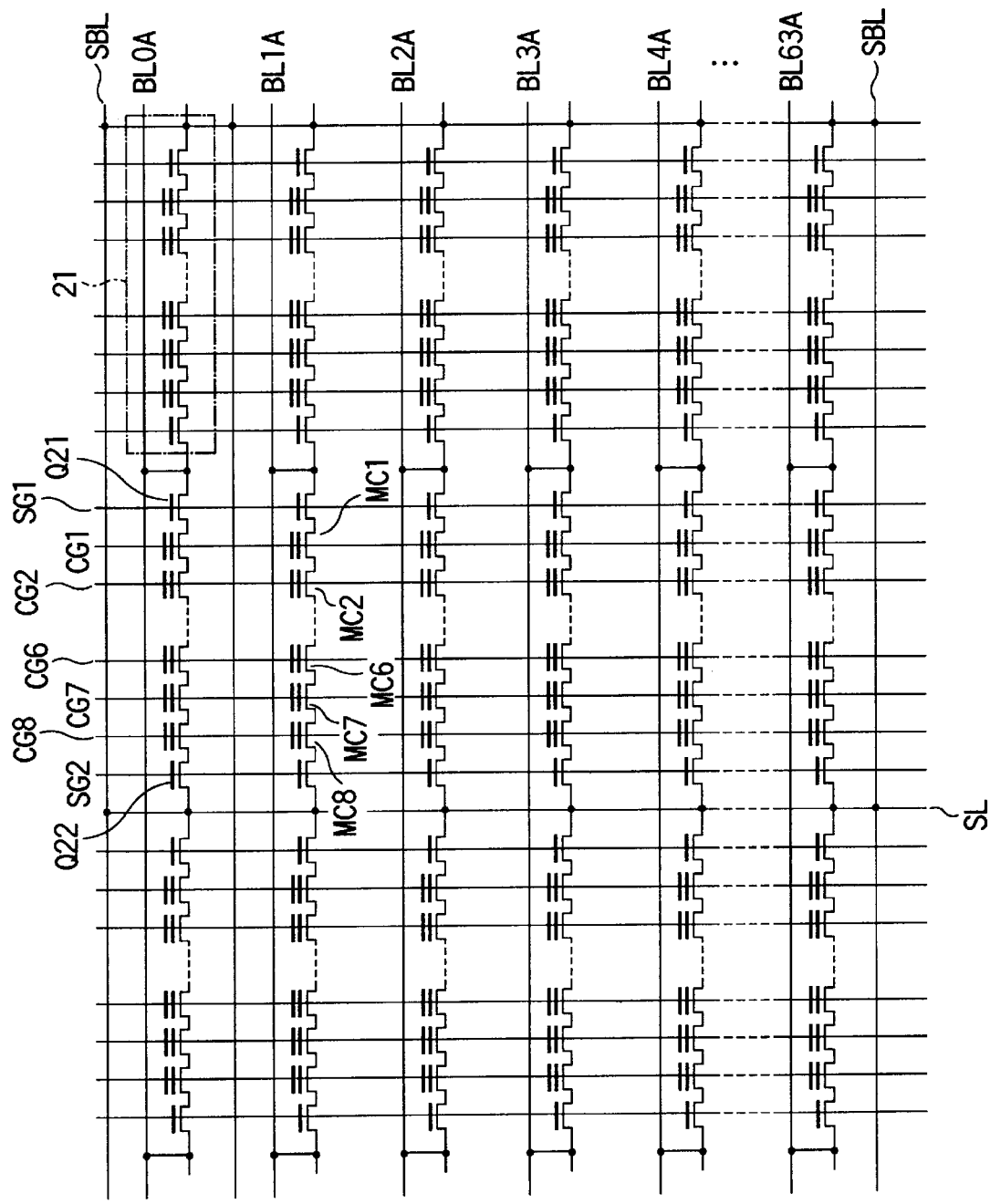
FIG. 2 is a diagram showing an example of a memory cell array of the present invention.

FIG. 2 illustrates an example of the memory cell array 1A shown in FIG. 1. The memory cell arrays 1A and 1B have substantially the same layout. In this example, a plurality of NAND cells 21 including, for example, eight memory cells and first and second select gates, are arranged in matrix in row and column directions. The first select gate transistors Q21 of the NAND cells are connected to their respective bit lines BL0A, BL1A, BL2A, BL3A, BL4A, . . . , BL63A. The second select gate transistors Q22 are connected to source lines SL arranged in the row direction, and the source lines SL are connected to source bias lines SBL formed of aluminum, polysilicon or the like and arranged in the column direction. One source line SL is provided every 64 bit lines and connected through a contact to the source bias lines SBL. The lines SBL are connected to the source line bias circuit 9.

One page is constituted of, e.g., 256-byte (256×8) memory cells. Data is written to the memory cells of one page almost at once. One block is constituted of, e.g., 2048-byte (2048×8) memory cells. Data is erased from the memory cells of one block almost at once.

Figure 3:
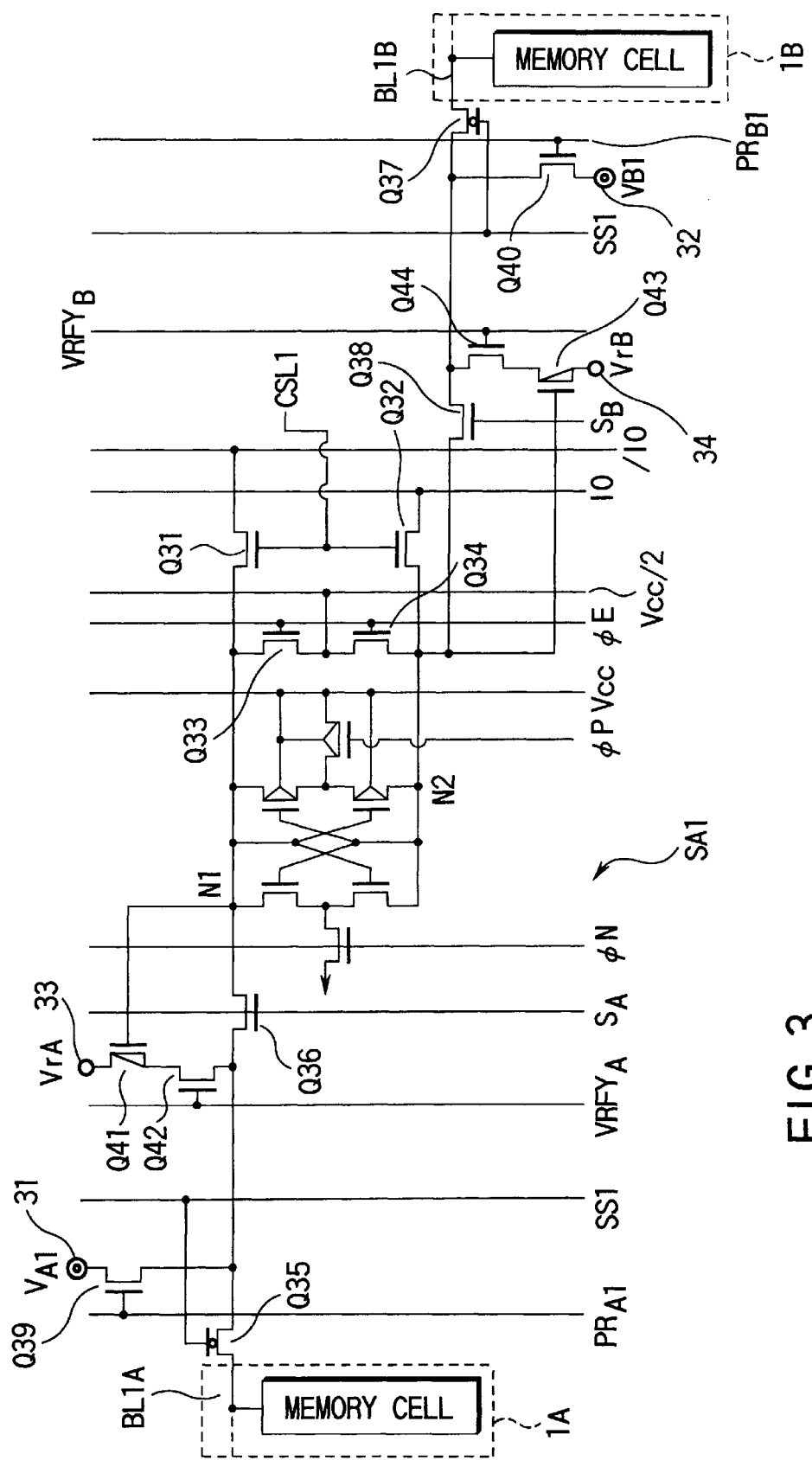
FIG. 3 is a circuit diagram of a sense amplifier circuit of the present invention.

FIG. 3 illustrates a specific example the sense amplifier circuit 2 of FIG. 1, that is, a sense amplifier SA1 for connecting the bit line BL1A of the memory cell array 1A and the bit line BL1B of the memory cell array 1B, and its peripheral circuits. The sense amplifier SA1 includes a function of a data latch circuit. The amplifier SA1 is activated by activation signals φN and φP. A transistor Q31 is connected between a node N1 of the sense amplifier SA1 and a data line /IO, and a transistor Q32 is connected between a node N2 and a data line IO. These transistors Q31 and Q32 are controlled in response to a column select signal CSL1 supplied from the column decoder 4.

Transistors Q33 and Q34, which are controlled by an equalize signal φE are connected between the nodes N1 and N2 of the sense amplifier SA1. A power supply voltage Vcc/2 is applied to a mutual connecting point of the transistors Q33 and Q34. If these transistors are turned on by the equalize signal φE, the nodes N1 and N2 are equalized to the power supply voltage Vcc/2.

Both a transistor Q35 controlled by a bit line select signal SS1 and a transistor Q36 controlled by a sense amplifier select signal $S_A$, are connected between the bit line BL1A and the node N1. Further, both a transistor Q37 controlled by the bit line select signal SS1 and a transistor Q38 controlled by a sense amplifier select signal $S_B$, are connected between the bit line BL1B and the node N2. A transistor Q39 controlled by a precharge signal $PR_{A1}$, is connected between a mutual connecting point of the transistors Q35 and Q36 and a power supply terminal 31. A precharge signal $V_{A1}$ is applied to the power supply terminal 31. The transistor Q39 precharges the bit line BL1A in response to the precharge signal $PR_{A1}$. A transistor Q40 controlled by a precharge signal $PR_{B1}$ is connected between a mutual connecting point of the transistors Q37 and Q38 and a power supply terminal 32. A precharge voltage $V_{B1}$ is applied to the power supply terminal 32. The transistor Q40 precharges the bit line BL1B in response to the precharge signal $PRB_{B1}$.

Transistors Q41 and Q42 are connected between a mutual connection point of the transistors Q35 and Q36 and a power supply terminal 33. A verify voltage VrA is applied to the power supply terminal 33. The gate of the transistor Q41 is connected to the node N1, and a verify signal $VRFY_A$ is supplied to the gate of the transistor Q42. Furthermore, transistors Q43 and Q44 are connected between a mutual connection point of the transistors Q37 and Q38 and a power supply terminal 34. A verify voltage VrB is applied to the power supply terminal 34. The gate of the transistor Q43 is connected to the node N2, and a verify signal $VRFY_B$ is supplied to the gate of the transistor Q44.

Figure 4:
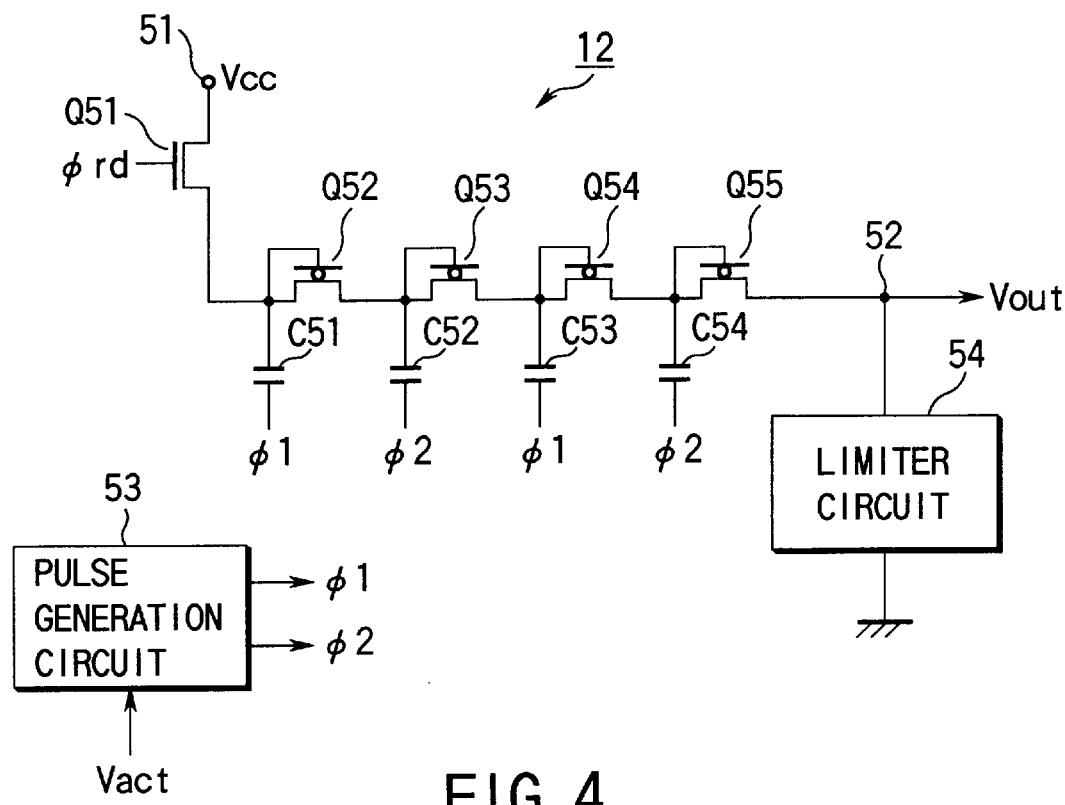
FIG. 4 is a circuit diagram showing one example of a booster circuit of the EEPROM of FIG. 1.
Figure 5:
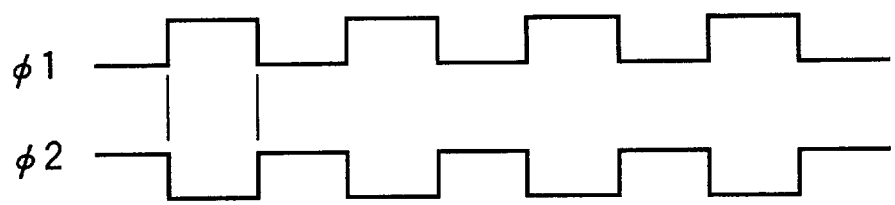
FIG. 5 is a view of waveforms of pulse signals for driving the circuit of FIG. 4.

FIG. 4 illustrates an example of the readout booster circuit 12 described above. In this example, diode-connected transistors Q51 to Q55 are connected between a terminal 51 to which a power supply voltage Vcc is input and an output node 52. One end of each of capacitors C51 to C54 is connected to its corresponding one of mutual connecting points of the transistors Q51 to Q55. The other ends of the capacitors C51 to C54 are supplied with driving pulse signals φ1 and φ2 which are generated from a pulse generation circuit 53 as shown in FIG. 5. The gate of the transistor Q51 is supplied with a control signal φrd. To activate the readout booster circuit 12, the control signal φrd is set to a high level and, in this state, the driving pulse signals φ1 and φ2 are supplied to the capacitors C51 to C54 and accordingly a boost voltage Vout is output from the output node 52. To inactivate the circuit 12, the control signal φrd is set to a low level. A limiter circuit 54 for limiting the boost voltage to a predetermined voltage is connected between the output node 52 and ground.

Figure 6:
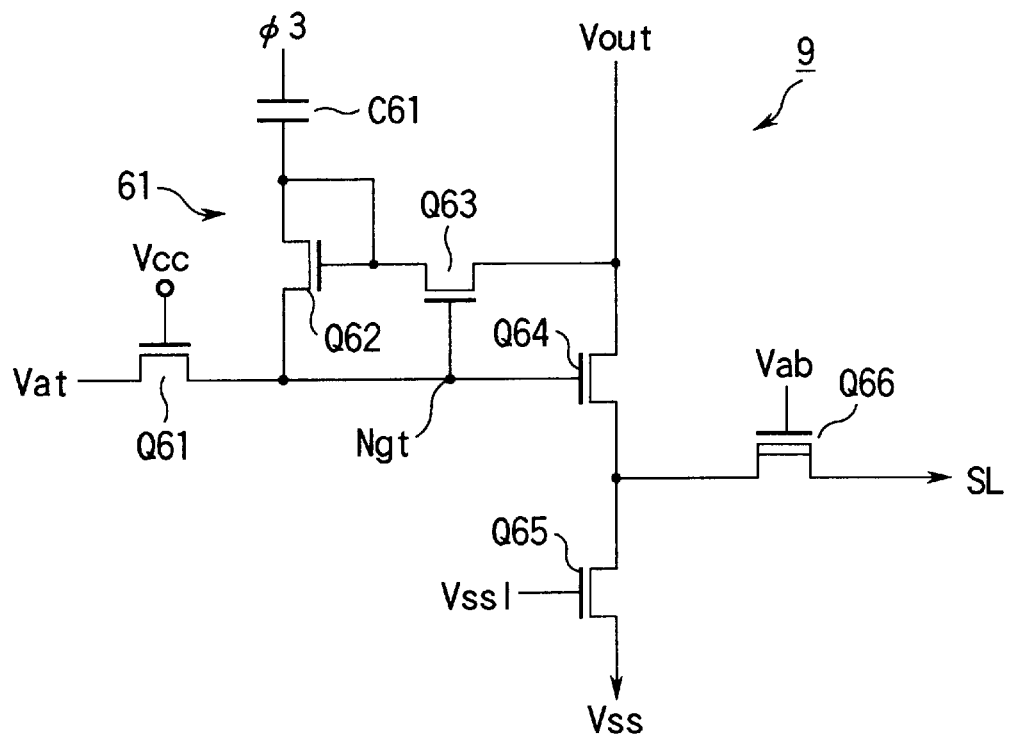
FIG. 6 is a circuit diagram showing one example of a source line bias circuit of the EEPROM of FIG. 1.

FIG. 6 shows an example of the source line bias circuit 9 of FIG. 1. The circuit 9 includes a switch circuit 61 for applying a potential output from the readout booster circuit 12, i.e., a boost voltage Vout as a write non-select potential, to the source lines in a data write mode. The switch circuit 61 is constituted of N-channel transistors Q61, Q62, Q63 and Q64 and a capacitor C61. A voltage Vat is applied to one end of a current path of the transistor Q61, and a power supply voltage Vcc is applied to the gate thereof. The other end of the current path of the transistor Q61 is connected to one end of a current path of the transistor Q62, the gate of the transistor Q63, and the gate of the transistor Q64. The other end of the current path of the transistor Q62 is connected to the gate of the transistor Q62, one end of a current path of the transistor Q63, and one electrode of the capacitor C61. The other electrode of the capacitor C61 is supplied with a driving pulse signal φ3.

The other end of the current path of the transistor Q63 is connected to one end of a current path of the transistor Q64. The boost voltage Vout output from the readout booster circuit 12 is applied to the one end of the current path of the transistor Q64. The other end of the current path of the transistor Q64 is grounded through a transistor Q65 and connected to the source line SL through a transistor Q66. A voltage VSS1 is applied to the gate of the transistor Q65, and a voltage Vab is applied to the gate of the transistor Q66. The transistor Q66 is a depletion type transistor whose threshold voltage is −1V and also a high withstanding transistor which withstands a voltage of 20V. The transistor Q66 is turned off in the erase mode to prevent an erase voltage of 20V, which is to be applied to the source line, from being applied to the transistors Q64 and Q65. In the readout or verify read mode, the level of VSS1 is set high and the transistor Q65 grounds the source line.

Figure 7:
FIG. 7 is a view of a waveform of a pulse signal for driving the circuit of FIG. 6.

In the switch circuit 61, when data is written, the signal Vat is set to a high level, and the driving pulse signal φ3, whose waveform is shown in FIG. 7, is supplied to the capacitor C61. If the boost voltage Vout output from the readout booster circuit 12 corresponds to a write non-select potential of 5V, a node Ngt serving as a gate of the transistor Q64 is increased to 6.5V. Thus, the transistor Q64 is able to transfer the boost voltage Vout (5V) to the source line SL. In order to set the node Ngt to a high voltage to charge the source line at high speed, it is desirable to use a transistor whose threshold voltage is low for the transistors Q62 and Q63. In the readout and verify read modes, the signal Vat is set to 0V and the transistor Q64 is turned off.

The voltage Vab which is to be applied to the gate of the transistor Q66, can be increased to about 6V. In this case, when data is written, the boost voltage Vout can be applied to the source line at high speed without decreasing by the threshold voltage of the transistor Q66.

Figure 8:
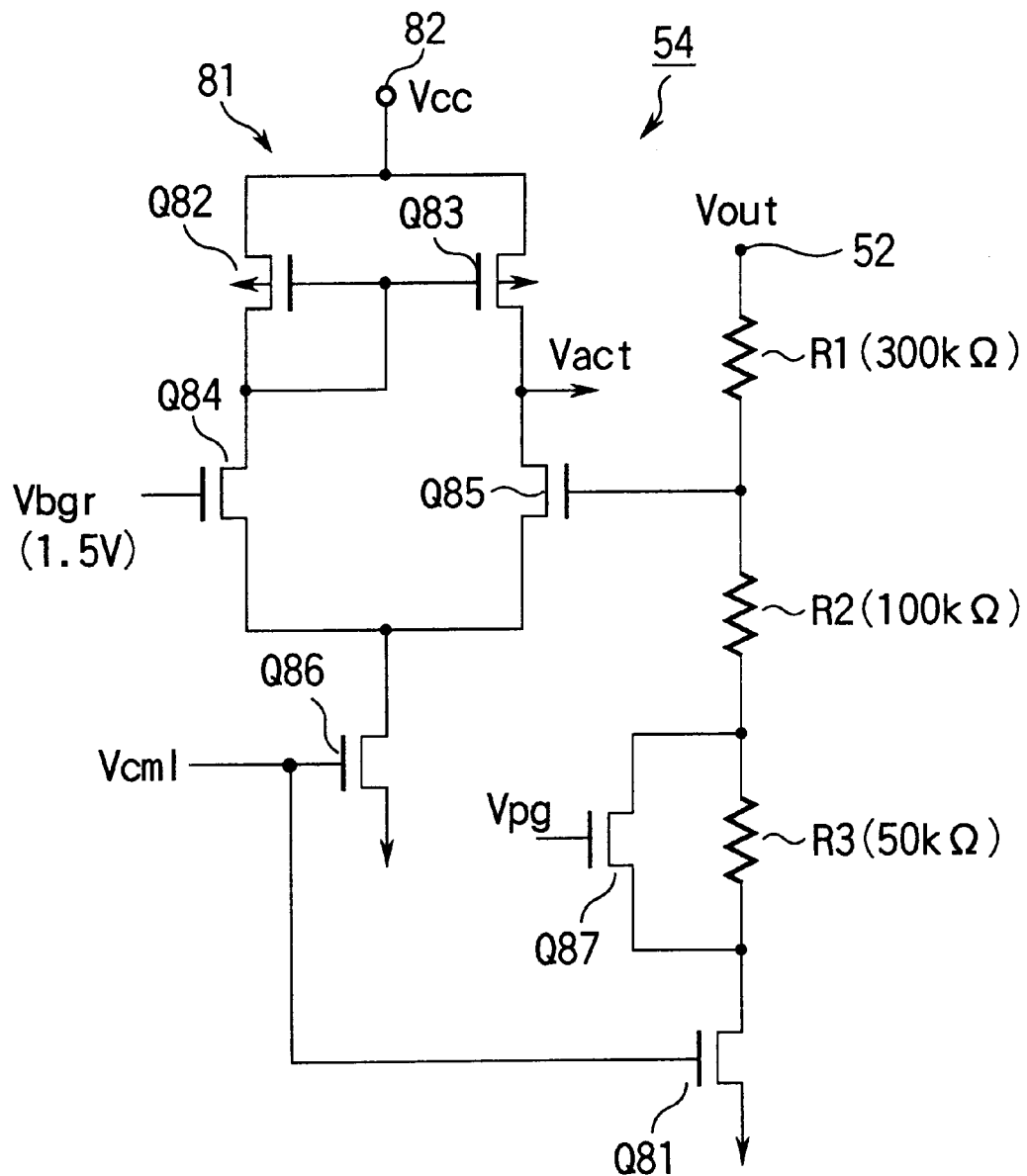
FIG. 8 is a circuit diagram showing one example of a limiter circuit of FIG. 4.

FIG. 8 illustrates an example of the limiter circuit 54 described above. In this example, resistors R1 to R3 and transistor Q81 are connected in series between the output node 52 of the readout booster circuit 12 shown in FIG. 4 and the ground. One end of a current path of each of p-channel transistors Q82 and Q83 constituting a differential amplifier 81 is connected to a power supply terminal 82. The other end of the current path of the transistor Q82 is connected to the gates of the transistors Q82 and Q83 and one end of a current path of an N-channel transistor Q84. A reference potential Vbgr is applied to the gate of the transistor Q84. The reference potential Vbgr is, for example, a voltage of 1.5V which is generated from a constant voltage generation circuit (not shown) constituted of a well-known band-gap reference circuit.

The other end of the current path of the transistor Q83 is connected to one end of a current path of an N-channel transistor Q85. The gate of the transistor Q85 is connected to a mutual connecting point between the resistors R1 and R2. The other ends of the current paths of the transistors Q84 and Q85 are grounded through an N-channel transistor Q86. The gates of the transistors Q86 and Q81 are supplied with a signal Vcm1.

An N-channel transistor Q87 is connected in parallel with the resistor R3. The gate of the transistor Q87 is supplied with a signal Vpg. A signal Vact is supplied from a mutual connecting point of the transistors Q83 and Q85 to the pulse generation circuit 53 to control an operation of the circuit 53.

In the foregoing layout, the signal Vcm1 is set to 0V when the voltage limiter circuit is inactivated and set to the power supply voltage Vcc when it is activated. If the signal Vpg is set to a high level in the write mode when the voltage limiter circuit is activated, the boost voltage Vout output from the readout booster circuit 12 is expressed by the following equation (1):

$$Vout = Vbgr \times (R1+R2)/R2 \quad (1)$$

When the boost voltage Vout is lower than the power supply voltage Vcc, the output signal Vact of the differential amplifier 81 becomes high in level. Thus, the driving pulse signals φ1 and φ2 as shown in FIG. 5 are output from the pulse generation circuit 53, and the boost voltage Vout output from the readout booster circuit 12 is increased.

On the other hand, when the boost voltage Vout is higher than the power supply voltage Vcc, the output signal Vact of the differential amplifier 81 becomes low in level. The driving pulse signals φ1 and φ2 of the pulse generation circuit 53 are fixed to high and low levels, respectively and thus the readout booster circuit 12 stops its operation.

When the boost voltage Vout is set to 4.5V in the read mode, the level of signal Vpg is set low and, in this case, the boost voltage Vout output from the readout booster circuit 12 is given by the following equation (2):

$$Vout = Vbgr \times (R1+R2+R3)/(R2+R3) \quad (2)$$

Both a write operation and a verify read operation in the foregoing layout will be described.

Figure 9:
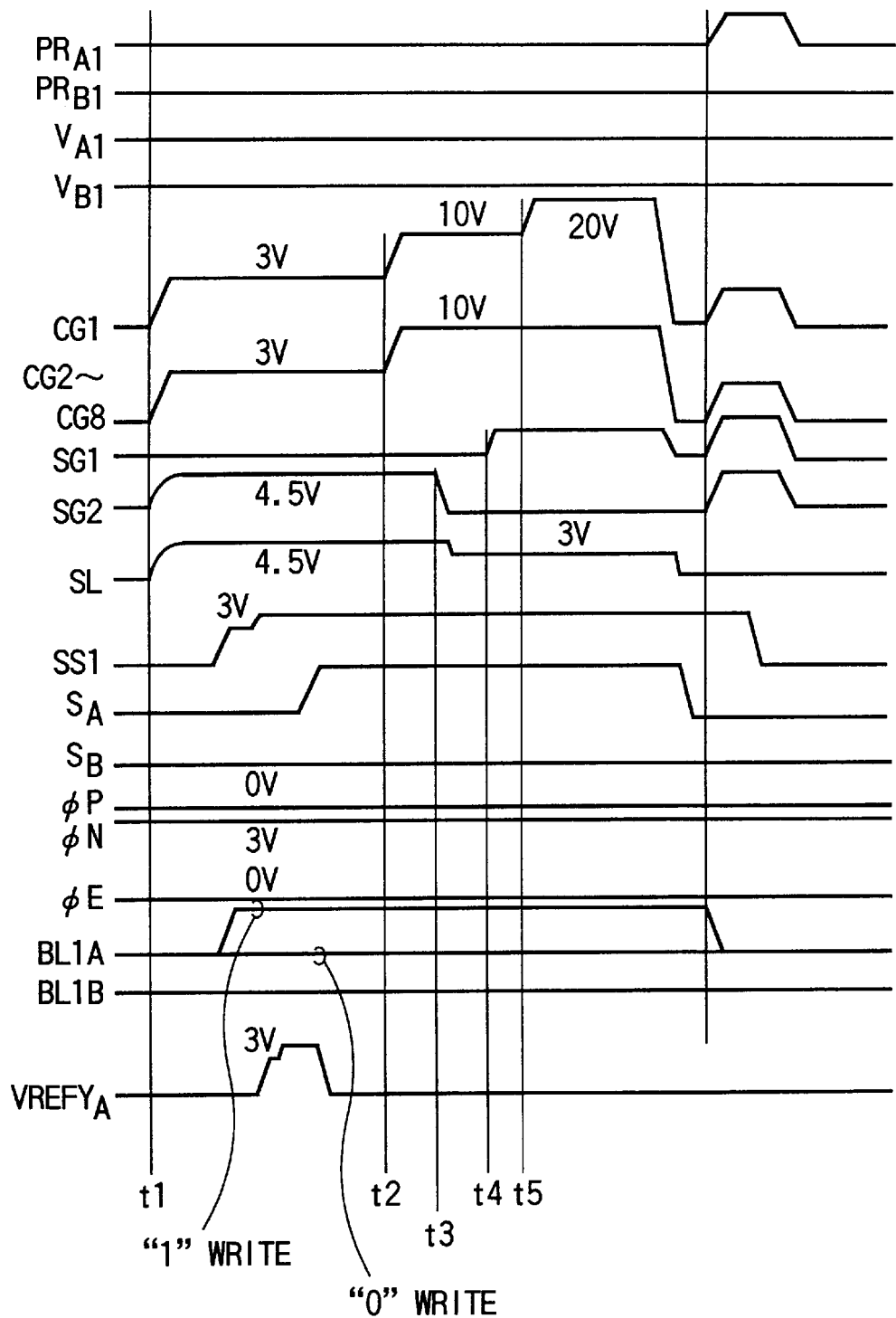
FIG. 9 is a timing chart for explaining a write operation according to the present invention.

An operation of writing data to the memory cell MC1 shown in FIG. 2 will be first described with reference to FIG. 9.

The data written to the memory cell MC1 is latched by the sense amplifier circuit SA1 shown in FIG. 3. When "0" is written thereto, the node N1 of circuit SA1 is set to 0V and the node N2 thereof is set to 3V. When "1" is written, the node N1 is set to 3V and the node N2 is set to 0V.

In the write operation, at time t1, the source line SL (source bias line SBL) is set to a voltage Vsl (e.g., 4.5V) as a write non-select potential which is higher than the power supply voltage Vcc (e.g., 3V) and lower than the erase voltage, and the second select gate line SG2 is set to the voltage Vsl, while the first select gate line SG1 is set to a ground voltage Vss (0V). The voltage Vsl is applied from the foregoing readout booster circuit 12, with the result that the second select gate line SG2 on the source line side turns off and goes into a floating state. The control gate lines CG1 to CG8 are set to the power supply voltage Vcc (3V) at time t1 and changed to 10V at time t2. Thus, the potential of the channel of each memory cell is increased from Vsl–Vthsg (Vthsg is a threshold voltage of the select gate connected to the source line, including the substrate bias effect) by capacitance coupling of the channel and the control gate. Conventionally, the potential of a channel of a memory cell is increased from Vcc–Vthsg by the capacitance coupling. In the present invention, however, the potential is increased from Vsl–Vthsg, which is higher than Vcc–Vthsg, up to, e.g., 8V which is higher than that in the conventional case.

At this time, a voltage which is higher than Vsl, e.g., Vsl+Vthsg or Vsl+2Vthsg can be applied to the second select gate line SG2 to set the potential of the channel of the memory cell to Vsl. Moreover, after the second select gate line SG2 is set to a voltage higher than Vsl to set the potential of the channel to Vsl, it can be set to Vsl and turned off and then the control gate lines CG1 to CG8 can be set to a voltage of 10V.

Before time t2, the bit line is set to power supply voltage Vcc or ground voltage Vss in accordance with the data latched in the sense amplifier circuit SA1. In this state, at time t3, the second select gate line SG2 is set to Vss and, at time t4, the first select gate line SG1 is set to Vcc. Since the first select gate transistor Q21 is turned on when "0" is written, the charging voltage of each memory cell is discharged to the bit line through the first select gate transistor Q21. Since the transistor Q21 is not turned on when "1" is written, the channel of each memory cell is held at a voltage of 8V.

After that, at time t5, a data writing high voltage of 20V is applied to a selected control gate line CG1. Since, in this case, a potential difference between the channel and control gate of a memory cell to which "0" is written is approximately 20V, electrons are injected into the floating gate. On the other hand, since the channel of a memory cell to which "1" is written is charged to 8V, a potential difference between the channel and control gate is small and thus no electrons are injected into the floating gate.

After the data is written completely, the control gates, select gates and bit lines are discharged in sequence. The write operation is thus completed.

According to the above embodiment, when data is written, a voltage which is higher than the power supply voltage and lower than the write voltage is applied to the source line SL, a precharge potential is set to a level higher than that of the power supply voltage before the channel of a memory cell is rendered in a floating state. The channel of the memory cell is thus self-boosted to a higher write inhibit voltage in accordance with the potential of the control gate. If, therefore, a data writing high voltage is applied to a selected control gate, it is possible to reliably prevent data from being written in error to the memory cell to which "1" is to be written.

When a potential which is higher than the power supply voltage Vcc is applied to the channel of a memory cell, it can be applied from the bit line side. Since a high voltage is applied to transistors connected to the bit line and constituting a circuit such as a sense amplifier, the transistors deteriorate in reliability. Such a transistor can be replaced with a high withstanding transistor; however, its size is large and thus the sense amplifier increases in area. The large area of the sense amplifier greatly increases the size of a chip since one chip includes, e.g., 4000 sense amplifiers.

According to the above embodiment, a write non-select potential is applied from the source line. Since the circuit related to the source line is common to a plurality of NAND cells, the number of elements are considerably smaller than that of the sense amplifier. In other words, one or several circuits have only to be provided in the peripheral circuit section; therefore, the chip can be prevented from increasing in size more than in the case where a high potential is applied from the bit line side. Taking into consideration a decrease in stress due to the application of high voltage, it is desirable to set the voltage applied to the source line lower than the erase voltage (e.g., 20V).

In the foregoing embodiment, the voltage Vsl is applied by transferring a boost voltage Vout output from the readout boost circuit 12. The circuit 12 is used to apply a voltage of, e.g., 4.5V to the select and control gates in the normal read mode and does not operate in the write mode. If, therefore, the circuit 12 is operated to generate the boost voltage Vout in the write mode, the chip area can be prevented from increasing. However, the circuit generating the boost voltage Vout is not limited to the readout booster circuit but can be replaced with another new booster circuit or an erase voltage generation circuit.

In a NAND cell type EEPROM, an apply circuit for applying a high voltage to the source line of a memory cell is connected to the source line such that a voltage of 20V can be applied to the p-type well and source line of the memory cell. Since, in FIG. 6, a voltage of 20V is applied to the source line SL, a high withstanding transistor Q66 is provided alongside the source line in the prior art case, too. If, therefore, the voltage Vsl (e.g., 4.5V) is applied from the source line as in the present invention, the number of additional circuit elements can be decreased even though the apply circuit connected to the source line is employed. For this reason, the chip area is not increased unlike in the case where a high voltage is applied from the bit line side.

The timing of the above write operation is very optional. In other words, the timing at which voltage Vsl is applied to the source line and the timing at which a voltage is applied to the select gate can be varied properly.

Figure 10:
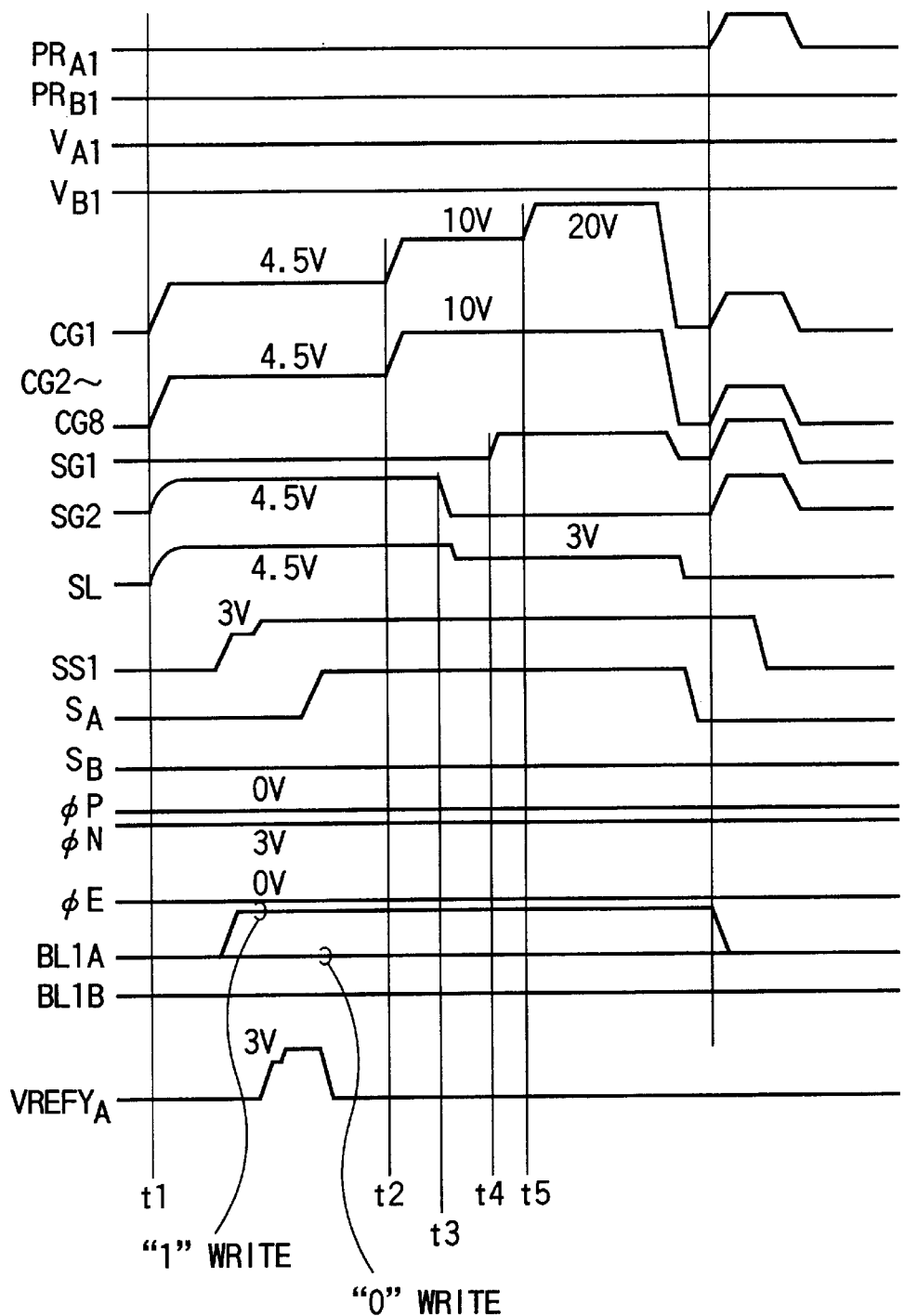
FIG. 10 is a timing chart for explaining another write operation according to the present invention.

As illustrated in FIG. 10, the source line SL and control gate lines CG1 to CG8 can be set to the voltage Vsl (4.5V) simultaneously at time t1. The potential of the source line can be transmitted adequately to the channel of a memory cell, and the control gate (word line) can be boosted at high speed.

Figure 11:
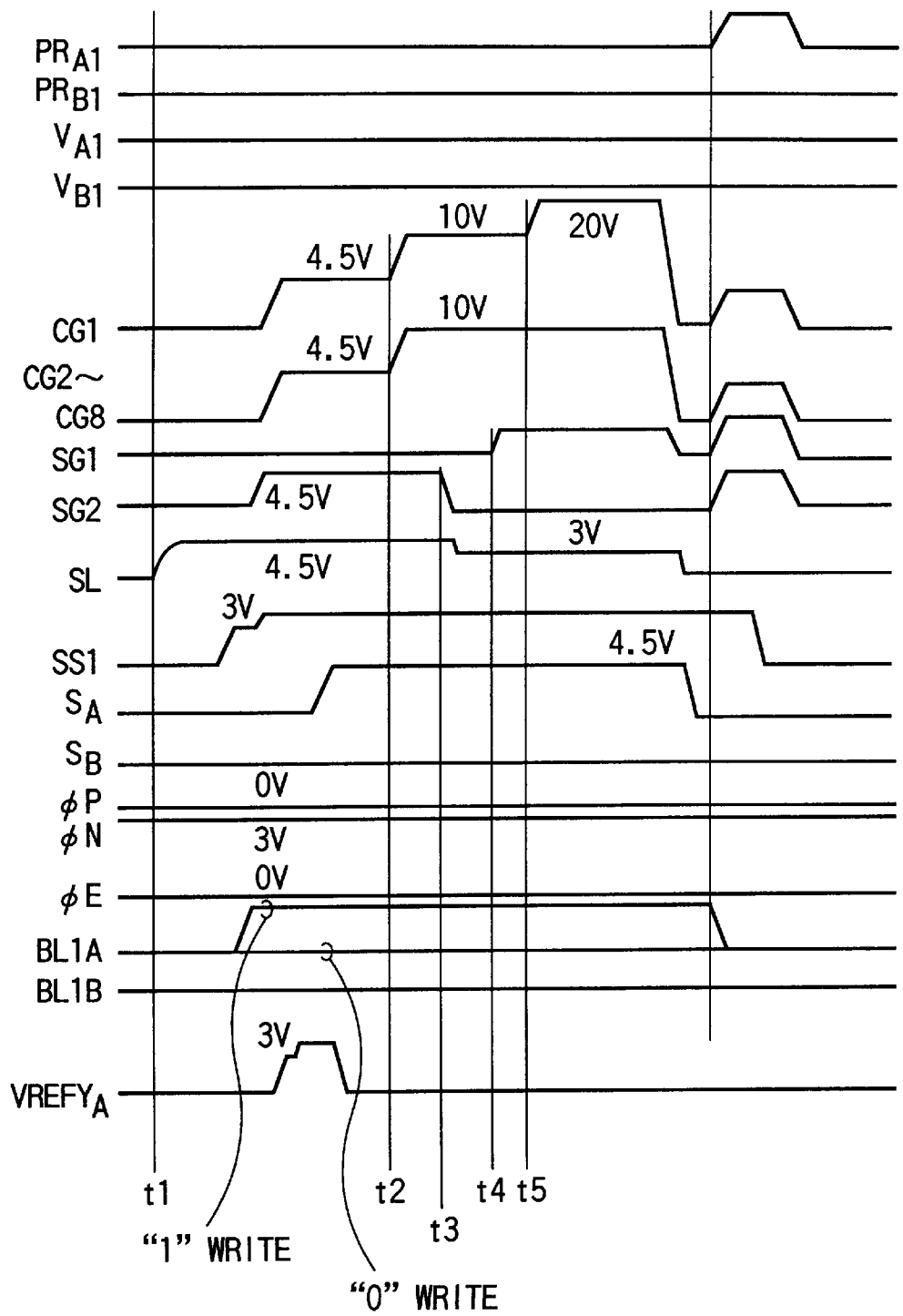
FIG. 11 is a timing chart for explaining still another write operation according to the present invention.

As shown in FIG. 11, for example, the control gate lines CG1 to CG8 and second select gate line SG2 can be set to the voltage Vsl after the source line SL is set to the voltage Vsl (4.5V) while write data is being loaded. Since, in this case, the source line is charged first, a high-speed write operation can be performed.

Figure 12:
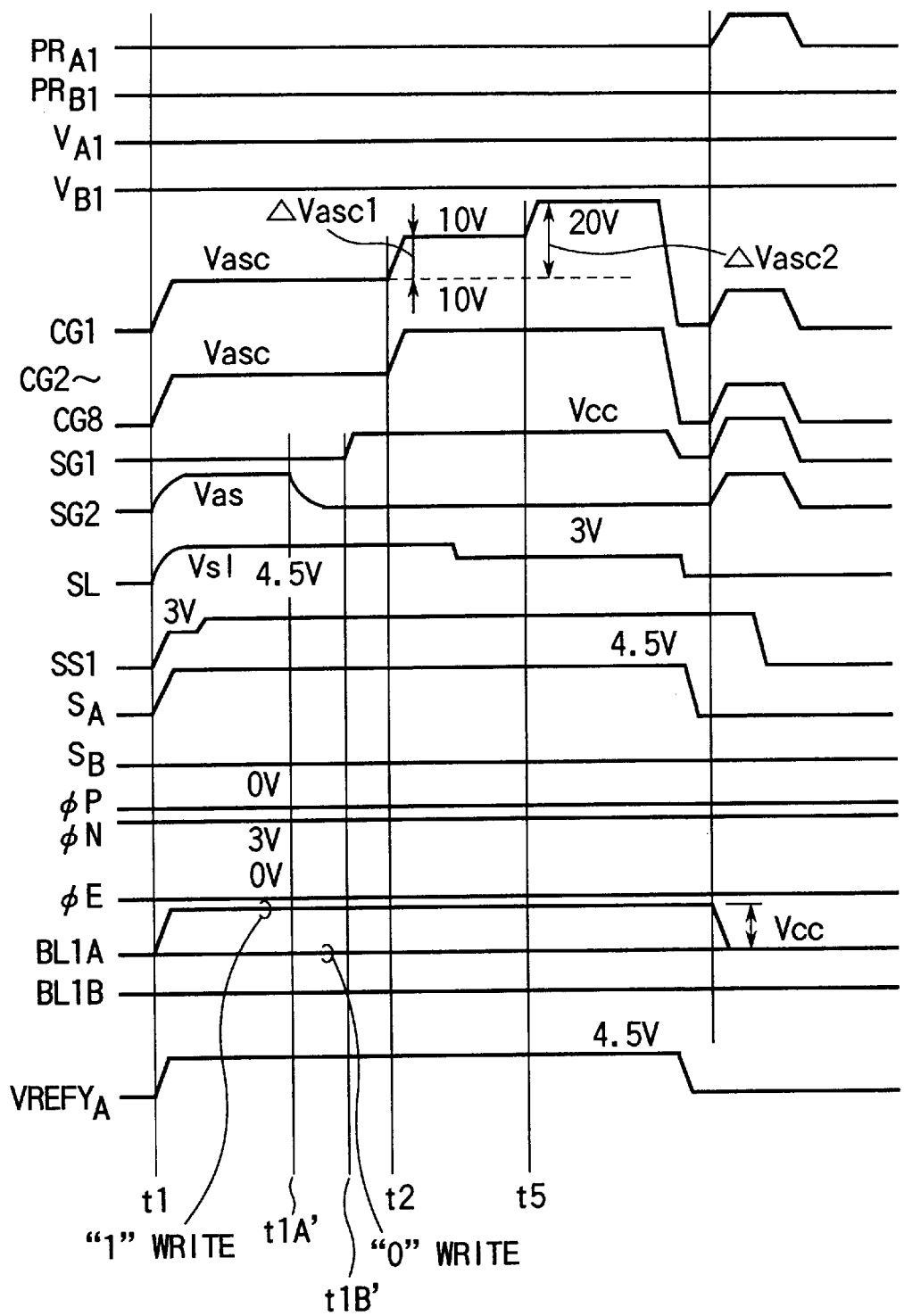
FIG. 12 is a timing chart for explaining yet another write operation according to the present invention.

FIG. 12 is a timing chart of another write operation.

In the write operation, at time t1, the source line SL is set to a voltage Vsl (e.g., 4.5V) which is higher than the power supply voltage Vcc, and the second select gate line SG2 is set to a voltage Vas while the first select gate line SG1 is set to a ground voltage Vss. The voltage Vas is capable of transferring the voltage Vsl to the channel of a memory cell without decreasing it by the threshold voltage of a selected gate and has only to be set to, e.g., Vsl+Vthsg. A voltage Vasc is applied to the control gate lines CG1 to CG8. The voltage Vasc is capable of transferring the voltage Vsl to the channel of a memory cell without decreasing it by the threshold voltage of the memory cell and has only to be set to, e.g., Vsl+Vthcell (Vthcell is a threshold voltage of a memory cell to which "0" is written, including the substrate bias effect). To simplify the circuit, both voltages Vas and Vasc can be set to the same potential.

After the channel of the memory cell is charged to the voltage Vsl, at time t1A', the second select gate line SG2 is set to Vss and at time t1B' the first select gate line SG1 is set to Vcc (e.g., 3V). At time t2, the control gate lines CG1 to CG8 are set to a voltage of 10V, with the result that the channel of the memory cell is increased in potential from Vsl by capacitance coupling of the channel and control gate.

According to the operation, the potential of the channel of the memory cell is increased from Vsl by capacitance coupling of the channel and control gate. Thus, the potential of the channel is increased further since the initial voltage is set high; thus it is possible to reliably prevent data from being written in error. After that, at time t5, a selected control gate line CG1 is set to 20V and data is written to a selected memory cell.

After the data is written completely, the control gates, select gates and bit lines are discharged in sequence. The write operation is thus completed.

Figure 13:
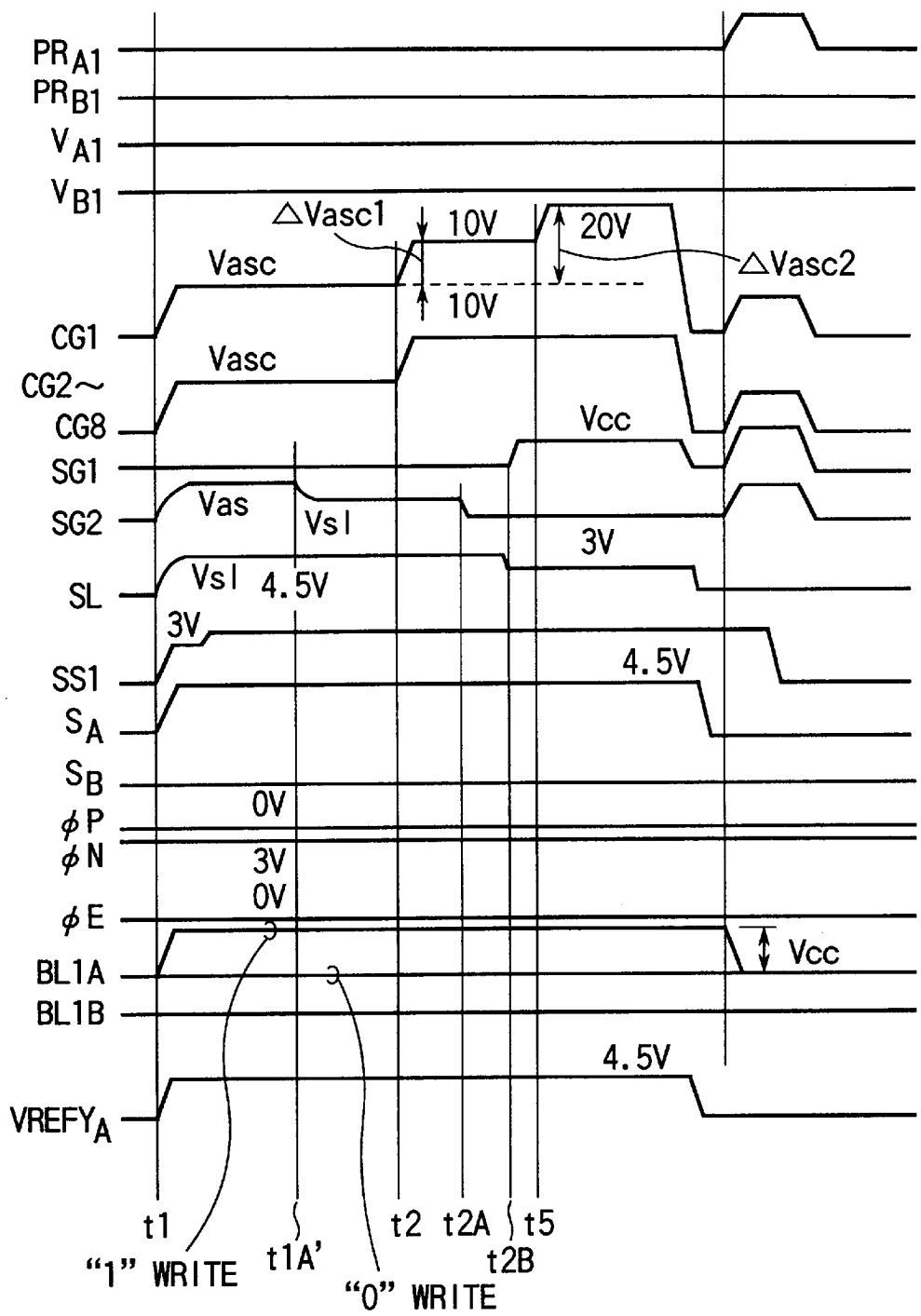
FIG. 13 is a timing chart for explaining still another write operation according to the present invention.

FIG. 13 is a timing chart of still another write operation. At time t1, the select gate SG2 is set to a voltage Vas (e.g., Vsl+Vthsg or Vsl+2Vthsg) and the channel of a memory cell is set to a voltage Vsl of a source line and, at time t1A', the select gate SG2 is set to a voltage Vsl. The select gate SG2 is thus turned off. At time t2, the control gates CG1 to CG8 are set to 10V and the channel is increased to about 8V. After that, the select gate SG2 is set to 0V at time t2A and the select gate SG1 is set to the power supply voltage Vcc at time t2B, thus transferring write data of the bit line to the memory cell. In other words, since the select gate SG1 is turned off when "1" is written (write non-selection), the channel of the memory cell is held at 8V. When "0" is written, the select gate SG1 is turned on and thus the channel of the memory cell is grounded. In this example, too, the same advantage of reliably preventing data from being written in error can be obtained as in the example of FIG. 12.

Figure 14:
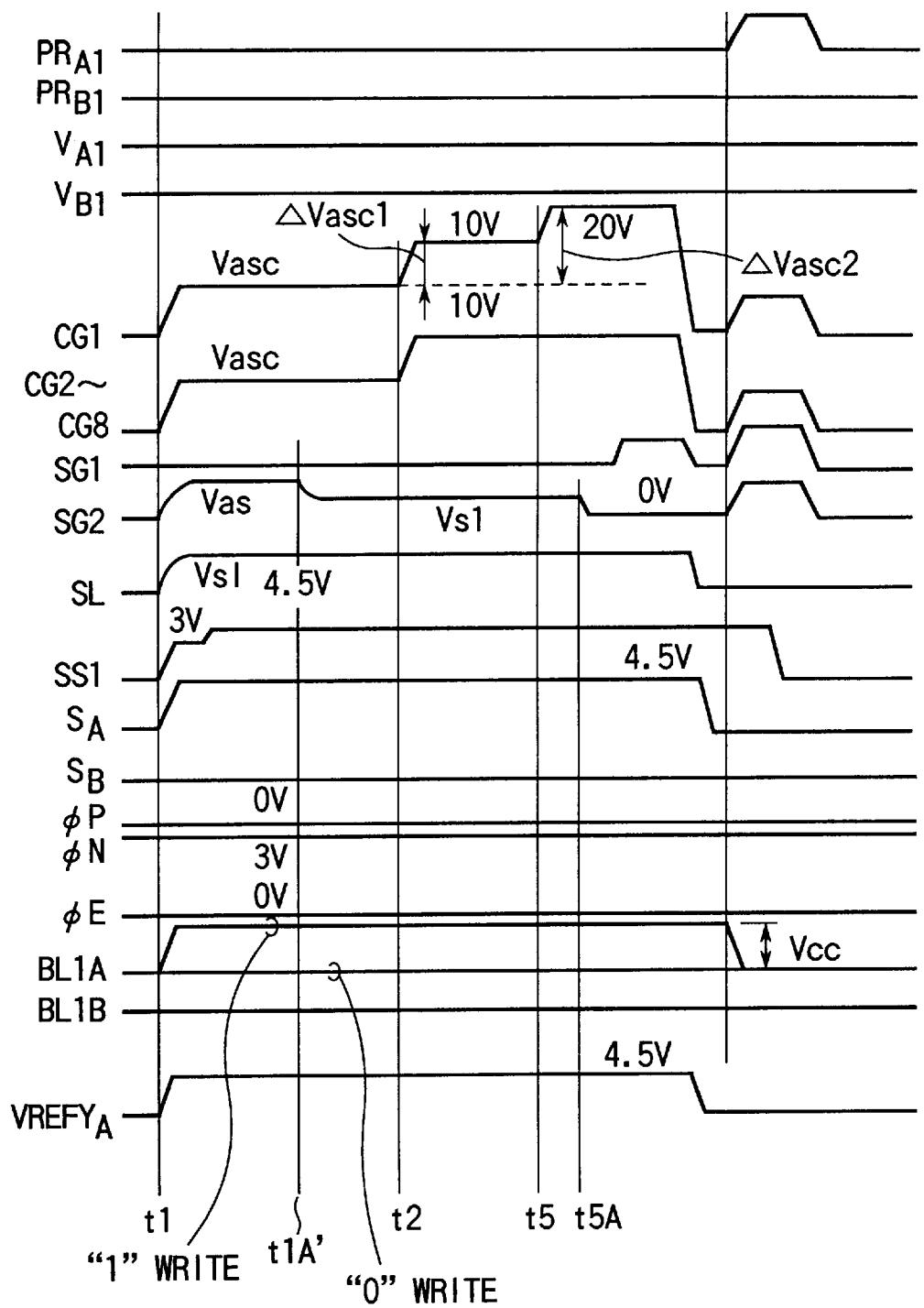
FIG. 14 is a timing chart for explaining yet another write operation according to the present invention.

The write operation can be performed at timing as shown in FIG. 14. The selected control gate CG1 is increased to 20V at time t5 and then the select gate SG2 is grounded to 0V at time t5A. In this example, too, the same advantage of reliably preventing data from being written in error can be obtained as in the example of FIG. 12.

Figure 15:
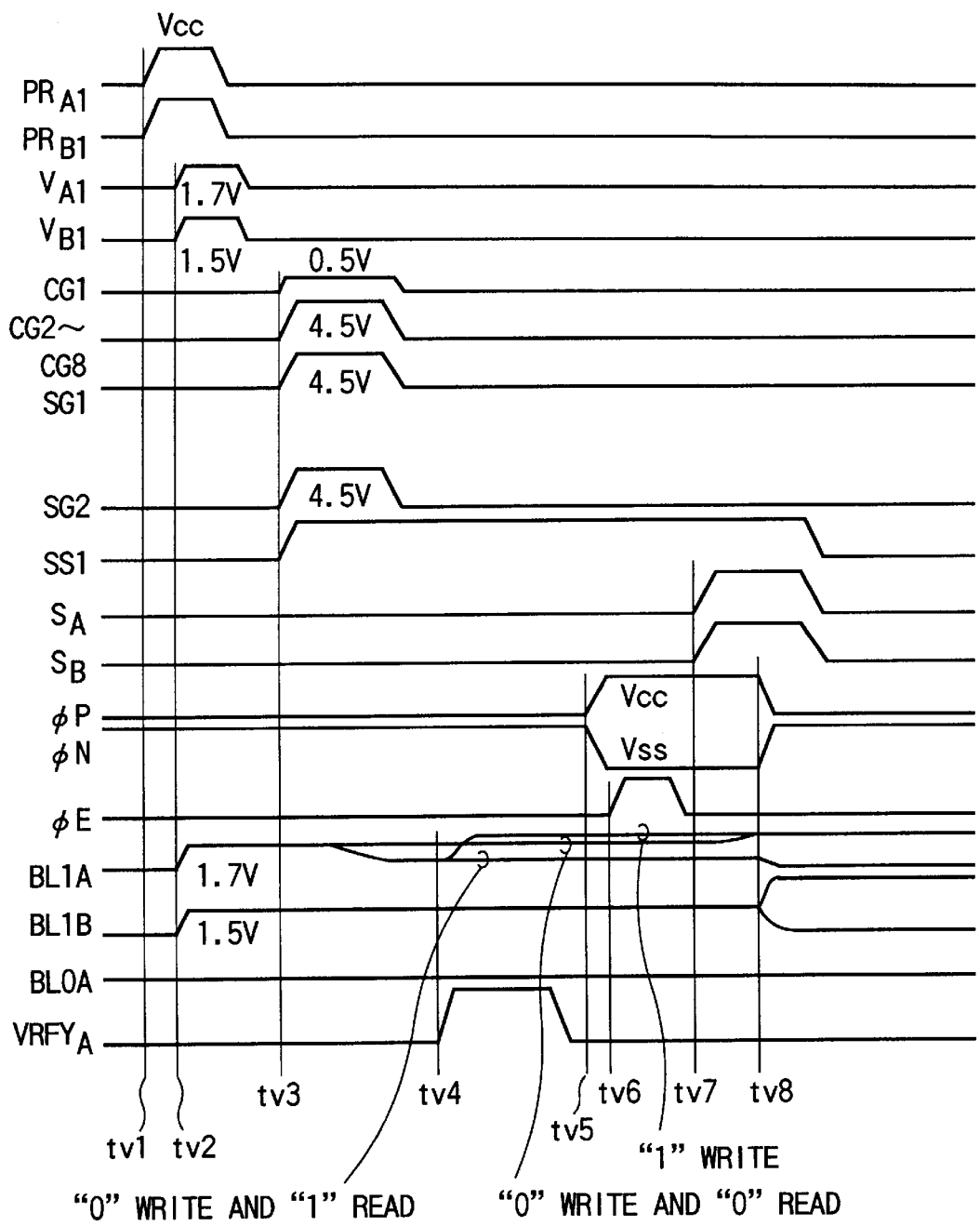
FIG. 15 is a timing chart for explaining a verify read operation according to the present invention.

After that, a verify read operation is performed to verify whether data is written sufficiently. FIG. 15 shows a timing chart of the verify read operation.

In FIG. 15, precharge signals $PR_{A1}$ and $PR_{B1}$ are changed from ground voltage Vss to power supply voltage Vcc (time tv1), and bit lines BL1A and BL1B (dummy bit line) are precharged to $V_{A1}$ (e.g., 1.7V) and $V_{B1}$ (e.g., 1.5V), respectively (time tv2).

After the precharge is completed, the precharge signals $PR_{A1}$ and $PR_{B1}$ are set to Vss and the bit line BL1A is set in a floating state. Then, a predetermined voltage is applied to the select and control gates from a row decoder 3A (time tv3). More specifically, a voltage of 0.5V is applied to the control gate line CG1, and that of 4.5V is applied to the control gate lines CG2 to CG8 and the first and second select gate SG1 and SG2. The voltage of 4.5V is one boosted from the power supply voltage Vcc by the readout booster circuit 12, and it is applied to the control gate lines and first and second select gates through the word line bias circuit 10. If "0" is adequately written to the memory cell MC1, the threshold voltage of the memory cell is positive and thus no cell current flows. The potential of the bit line BL1A remains at 1.7V. If "1" is written to the memory cell or "0" is not adequately written thereto, cell current flows through the memory cell, and the potential of the bit line BL1A decreases to 1.5V or lower. In the meantime, the bit line BL1B remains at a precharge voltage of 1.5V.

At time tv4, when "1" is written using a verify signal VRFY$_A$ as the power supply voltage Vcc, the bit line BL1A is charged to VRA (which is higher than 1.7V).

At time tv5, a sense amplifier activation signal φP is set to the power supply voltage Vcc and a sense amplifier activation signal φN is set to the ground voltage to inactivate the sense amplifier SA1. At time tv6, when an equalize signal φE is set to the power supply voltage Vcc, the sense amplifier SA1 is equalized and nodes N1 and N2 are set to Vcc/2 (e.g., 1.5V). At time tv7, sense amplifier select signals S$_A$ and S$_B$ are set to the power supply voltage Vcc. After the bit line and sense amplifier are connected to each other, the sense amplifier activation signal φN is set to the power supply voltage Vcc and the sense amplifier activation signal φP is set to the ground voltage, a potential difference between the bit line BL1A and dummy bit line BL1B is amplified, and rewrite data is latched (time tv8). In other words, if "1" is written or "0" is written adequately, the nodes N1 and N2 of the sense amplifier S$_{A1}$ are set to the power supply voltage and ground voltage, respectively. After that, "0" is not written any more. If "0" is written inadequately, the nodes N1 and N2 are set to the ground voltage and power supply voltage, and additional write is performed.

If data is written to all the memory cells sufficiently, the node N1 is set to the power supply voltage Vcc as a result of the verify read and thus the completion of write can be detected by monitoring the potential of the node N1.

In the above-described embodiments, an open bit line type memory cell array is employed. However, the present invention is applicable to a folded bit line type memory cell array and a single end type memory cell array.

In a prior art NAND cell type EEPROM, the write non-select potential is transferred from the bit line to the channels of memory cells, and data is written in sequence to the memory cells, from the memory cell alongside the source line down, such that the write non-select potential is transferred to the bit line with efficiency. To write data to the memory cells selected by the control gate lines CG1 to CG8 as shown in, e.g., FIG. 2, the data is written first to the memory cell connected to the control gate line CG8 and then to the memory cells connected to the control gate lines CG7, CG6, CG5, CG4, CG3, CG2 and CG1 in this order.

In contrast, according to the present invention, the write non-select potential Vsl is transferred from the source line to the channels of memory cells. In order to transfer the potential Vsl of the source line to the channels of the memory cells without dropping the threshold voltage of the memory cells, data has only to be written first to the memory cell located alongside the bit line. To write data to the memory cells selected by the control gate lines CG1 to CG8 shown in, e.g., FIG. 2, the data is written first to the memory cell connected to the control gate line CG1. When data is written to the memory cell connected to the control gate line CG1, the memory cells connected to the other control gate lines CG2 to CG8 are in an erase state and thus the threshold voltage of the memory cells is negative. Therefore, even though the potential Vasc of the control gate lines CG1 to CG8 between time t1 and t1A' as shown in FIG. 12 is set to, e.g., Vsl when the potential of the source line is transferred, the potential Vsl can be transferred to the channels without decreasing it by the threshold voltage of the memory cells.

If, as described above, data is written first to the memory cell alongside the bit line, the potential Vsl of the source line can be transferred to the channels of the memory cells even though the potential Vasc corresponds to Vsl which is lower than Vsl+Vthcell of the above embodiments. If Vasc can be lowered, the voltages ΔVasc1 and ΔVasc2 of the control gate, which rise after time t2, can be increased as shown in FIG. 12; accordingly, the memory cells can be increased further in channel potential and improved in reliability. Data is written first to the memory cell connected to the control gate line CG1 and then to the memory cells connected to the control gate lines CG2, CG3, CG4, CG5, CG6, CG7 and CG8 in this order.

It is desirable that when the potential Vsl (e.g., 5V) of the source line is transferred to a memory cell of a selected control gate line, the potential Vasc of the control gate lines CG1 to CG8 (FIG. 12) be the minimum voltage at which the potential Vsl can be transferred without decreasing by the threshold voltage. When Vasc is too high, the voltages ΔVasc1 and ΔVasc2 of the control gates, which rise after time t2, become lower, with the result that the channel potential is lowered and data is easy to be written in error. When data is written first to the memory cell located alongside the bit line, it is the most suitable to set the potential Vasc as follows when the potential Vsl of the source line is transferred.

When data is written to the memory cell MC1 shown in, e.g., FIG. 2, the threshold voltages of memory cells MC1 to MC8 are all negative and thus the control gates CG1 to CG8 are set to voltage Vsl. Otherwise, since the threshold voltages of the memory cells are all Vdcell (e.g., −1V) or lower, the control gates can be set to Vsl−|Vdcell| (e.g., 4V).

Since there is a case where the threshold voltage of only the memory cell MC1 is positive when data is written to the memory cell MC2, the control gate line CG1 can be set to Vsl+Vthcell and the control gate lines CG2 to CG8 can be set to Vsl or Vsl−|Vdcell|. Vthcell indicates a threshold voltage of a memory cell in the "0" state and is, for example, 1V. The control gate line CG1 can thus be set to 6V.

Similarly, when data is written to the memory cell MC6, the control gate lines CG1 to CG5 can be set to Vsl+Vthcell and the control gate lines CG7 and CG8 can be set to Vsl or Vsl−|Vdcell|.

When data is written to the memory cell MC8, the control gate lines CG1 to CG7 can be set to Vsl+Vthcell and the control gate line CG8 can be set to Vsl or Vsl−|Vdcell|.

Even when data is written to any memory cell, the first select gate line SG1 can be set to the ground potential and the second select gate line SG2 can be set to Vas while the potential Vsl of the source line is being transferred to the channel of the memory cell. Vas is a voltage at which Vsl can be transferred without being decreased in threshold voltage and can be set to, for example, Vsl+Vthsg or Vsl+2Vthsg.

Figure 16:
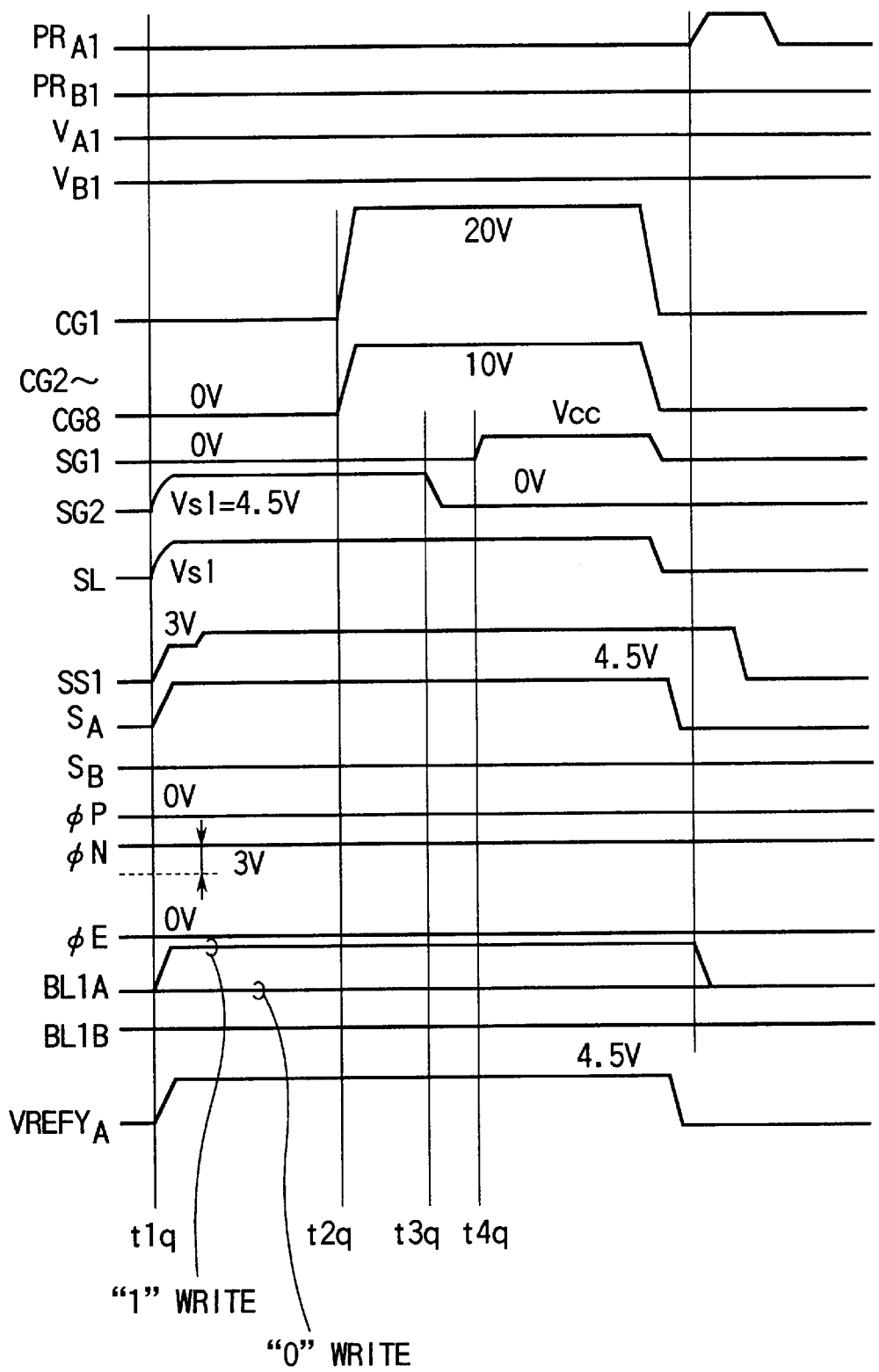
FIG. 16 is a timing chart for explaining still another write operation according to the present invention.
Figure 17:
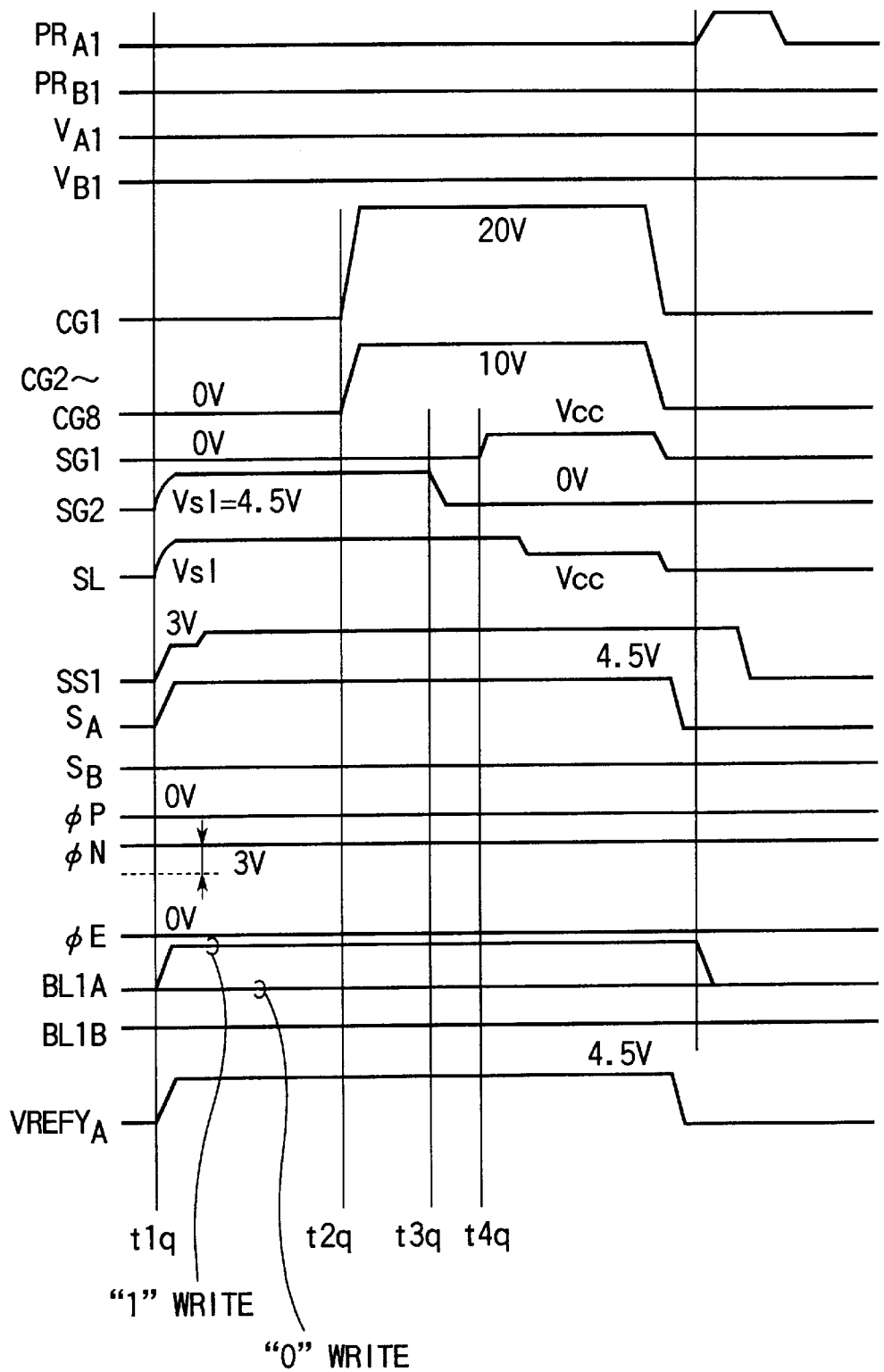
FIG. 17 is a timing chart for explaining still another write operation according to the present invention.
Figure 18:
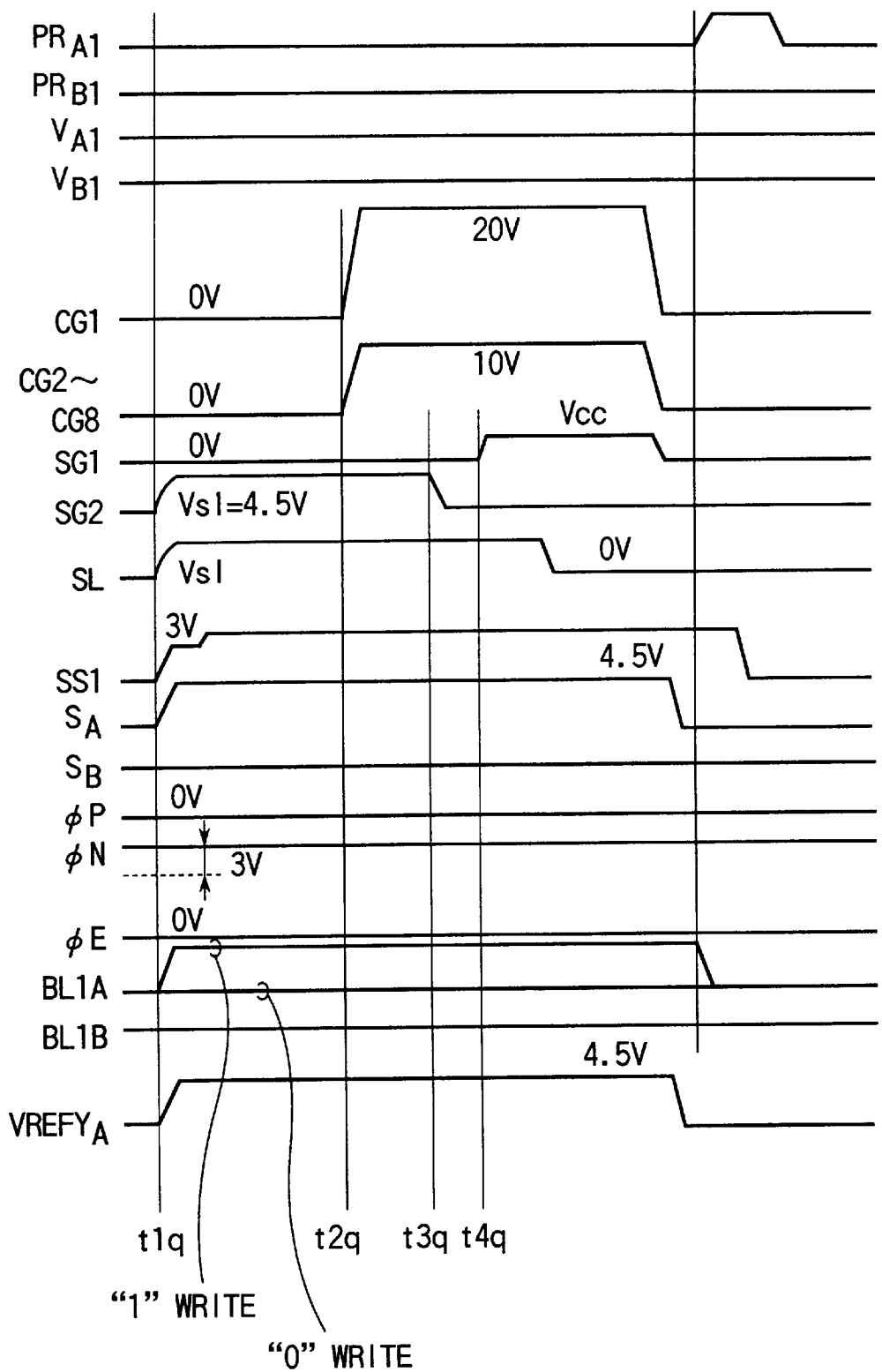
FIG. 18 is a timing chart for explaining still another write operation according to the present invention.

FIGS. 16 to 18 each shows a modification to the operation timing of the control and select gates in the write mode.

FIG. 16 illustrates an example in which data is written to the memory cell MC1 of FIG. 2. In this example, at time t1q, the source line SL and second select gate SG2 are charged with voltage Vsl as a write non-select potential which is higher than the power supply voltage and lower than the erase voltage. After that, at time t2q, the voltage of control gate line CG1 is increased to 20V and those of control gate lines CG2 to CG8 are each increased to 10V, with the result that the voltage of the channel of the memory cell is increased to about 8V by coupling capacitance of the channel and the control gate CG. The second select gate SG2 is set to 0V at time t3q and then the first select gate SG1 is set to power supply voltage Vcc at time t4q. As a result, the channel of a transistor of "0" write is discharged to 0V, while that of a transistor of "1" write is held at 8V.

The operations at time t1q to time t3q in FIG. 17 are the same as those in FIG. 16. In FIG. 17, the second select gate SG2 is set to 0V at time t3q and then the source line SL is set to power supply voltage Vcc.

The operations at time t1q to time t3q in FIG. 18 are also the same as those in FIG. 16. In FIG. 18, the second select gate SG2 is set to 0V at time t3q and then the source line SL is set to ground voltage 0V.

Since the operations shown in FIGS. 16 to 18 do not need voltage Vas, Voltage Vasc or the like, they can be simplified and stabilized. Moreover, no circuits for producing these voltages are required and thus the area of the circuits in the device can be reduced and the power consumption can be decreased.

Figure 19:
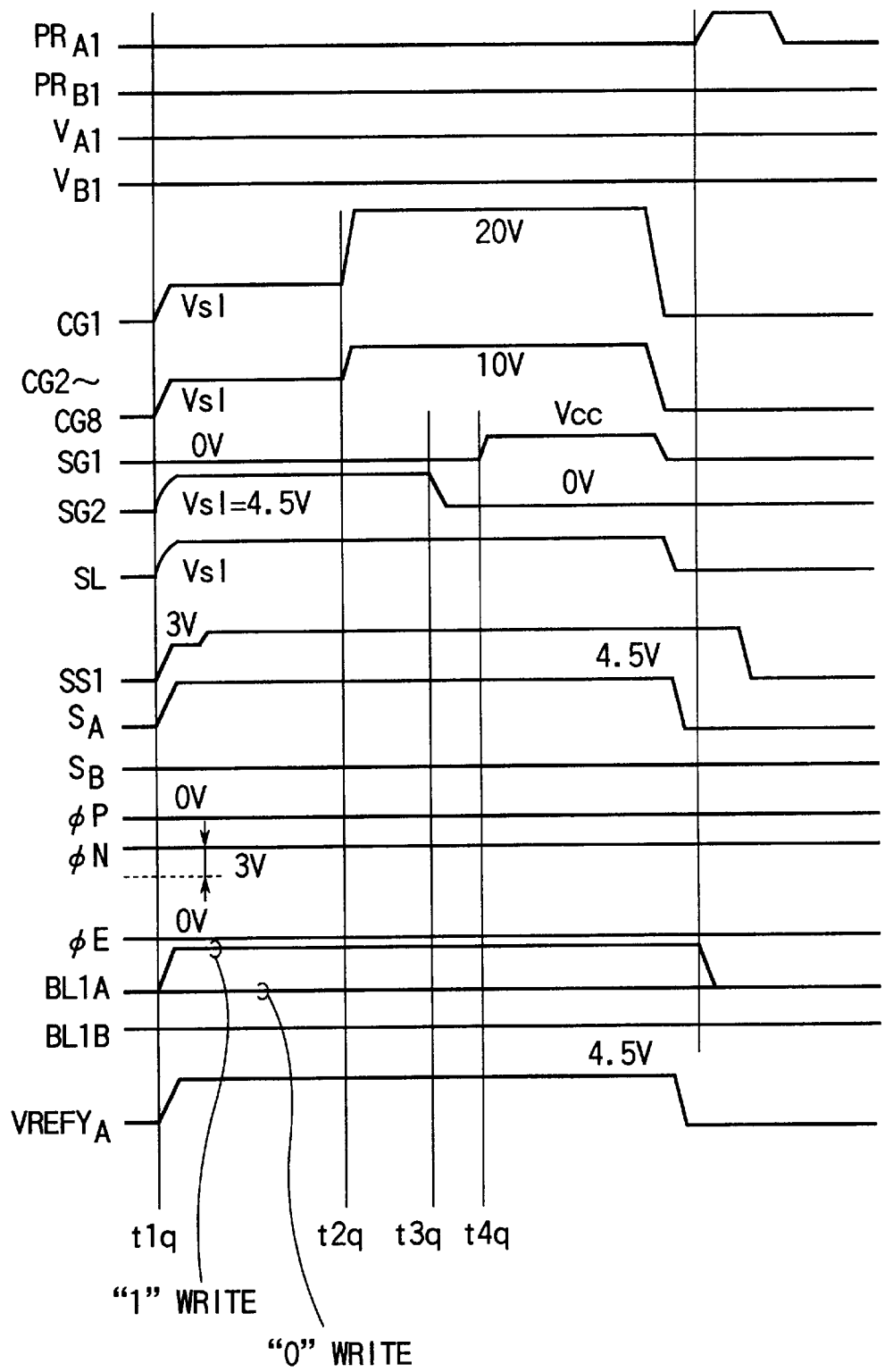
FIG. 19 is a timing chart for explaining still another write operation according to the present invention.

FIG. 19 shows another modification to the operation timing of the control and select gates in the write mode. In the operation of FIG. 16, the control gate lines CG1 to CG8 are set to ground voltage 0V between time t1q and t2q. In the operation of FIG. 19, the control gate lines CG1 to CG8 are set to write non-select potential Vsl between time t1q and time t2q and, in this case, the channel of a memory cell can be charged from the source line between time t1q and t2q.

Figure 29:
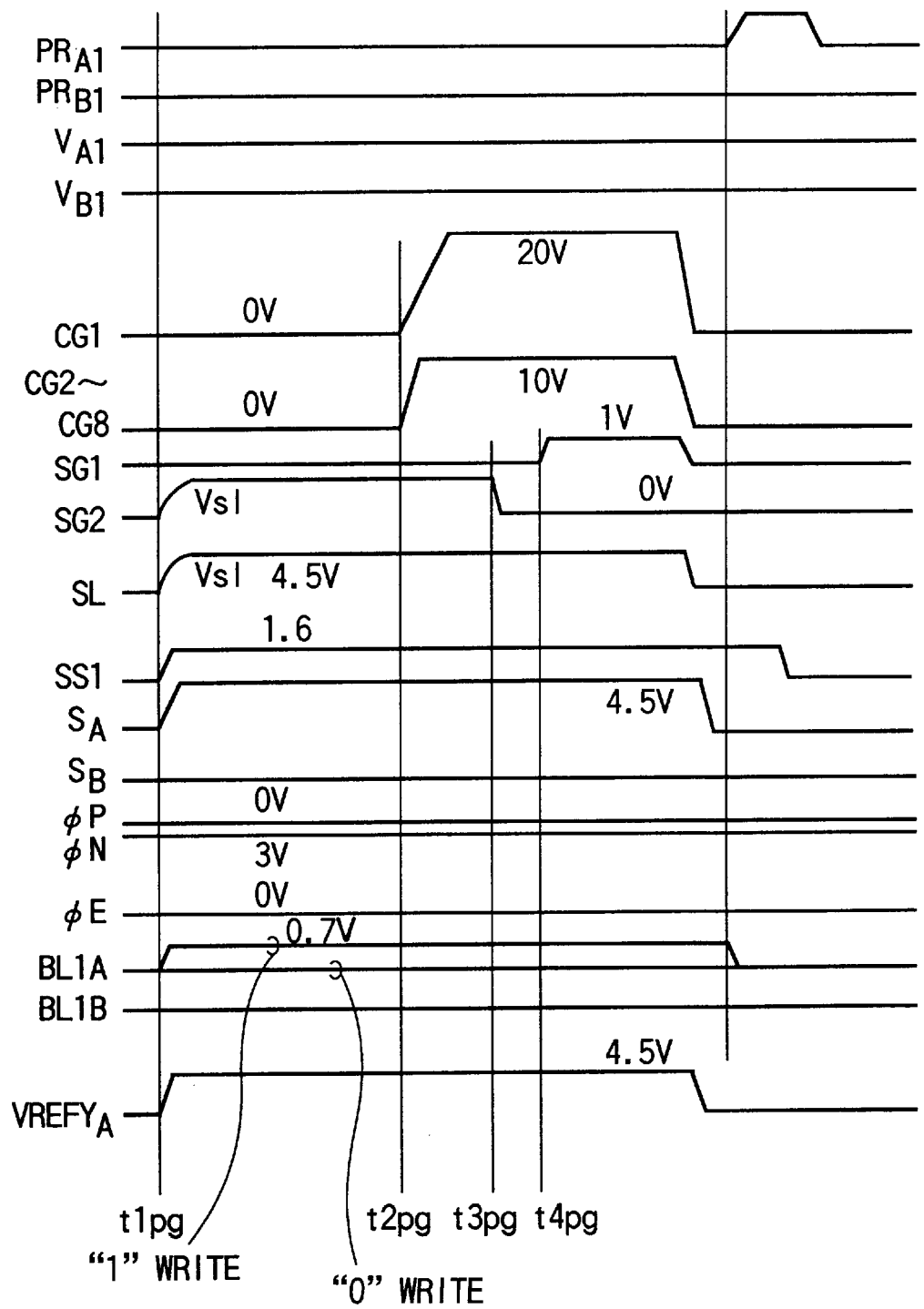
FIG. 29 is a timing chart for explaining another write operation according to the present invention.

In the write operation of the present invention, the potential of a bit line can be made lower than the power supply voltage Vcc when "1" is written thereto. This will now be described with reference to FIG. 29. FIG. 29 also illustrates an operation of writing data to the memory cell MC1 of FIG. 2.

At time t1pg, a source line SL and a second select gate SG2 are charged with Vsl and, at time t2pg, a control gate line CG1 is boosted to 20V while the other control gates CG2 to CG8 are boosted to 10V, with the result that the channel potential of a memory cell is increased to about 8V by capacitance coupling of the channel and the control gate CG. The second select gate SG2 is set to 0V at time t3pg and then the first select gate SG1 is set to 1V at time t4pg. During this period of time, the bit line to which "0" is written is charged to 0V, while the bit line to which "1" is written is charged to 0.7V. In order to charge the bit line with a voltage of 0.7V, a bit line select signal $SS_1$ has only to be set to 1.6V. The channel to which "0" is to be written is thus discharged to 0V. On the other hand, when "1" is to be written, the voltage of the bit line is 0.7V and the gate threshold voltage of a selected transistor whose first select gate SG1 serves as a gate electrode, is about 0.6V and thus the transistor is turned off. The channel to which "1" is to be written is thus maintained at 8V. The source line can be set to the power supply voltage Vcc or 0V after the second select gate SG2 is set to 0V at time t3pg.

As described above, according to the present invention, the potential of the bit line to which "1" is written can be made lower than the power supply voltage, which is applied to a chip from outside as in the prior art case, or an in-chip power supply voltage obtained by dropping the power supply voltage applied from outside. Since, in a NAND type flash memory, the capacitance of the bit line is large, half and more of the current consumed when data is written is required for charging the bit line. Therefore, the current consumption can greatly be reduced by decreasing the voltage of the "1" write bit line to 0.7V from the power supply voltage (e.g., 3.3V).

The operations of reading and erasing data in the present invention are similar to those in the prior art such as T. Tanaka et al., IEEE J. "Solid-State Circuit", Vol.29, pp.1366–1373, 1994. Only the read operation will now be described.

Figure 20:
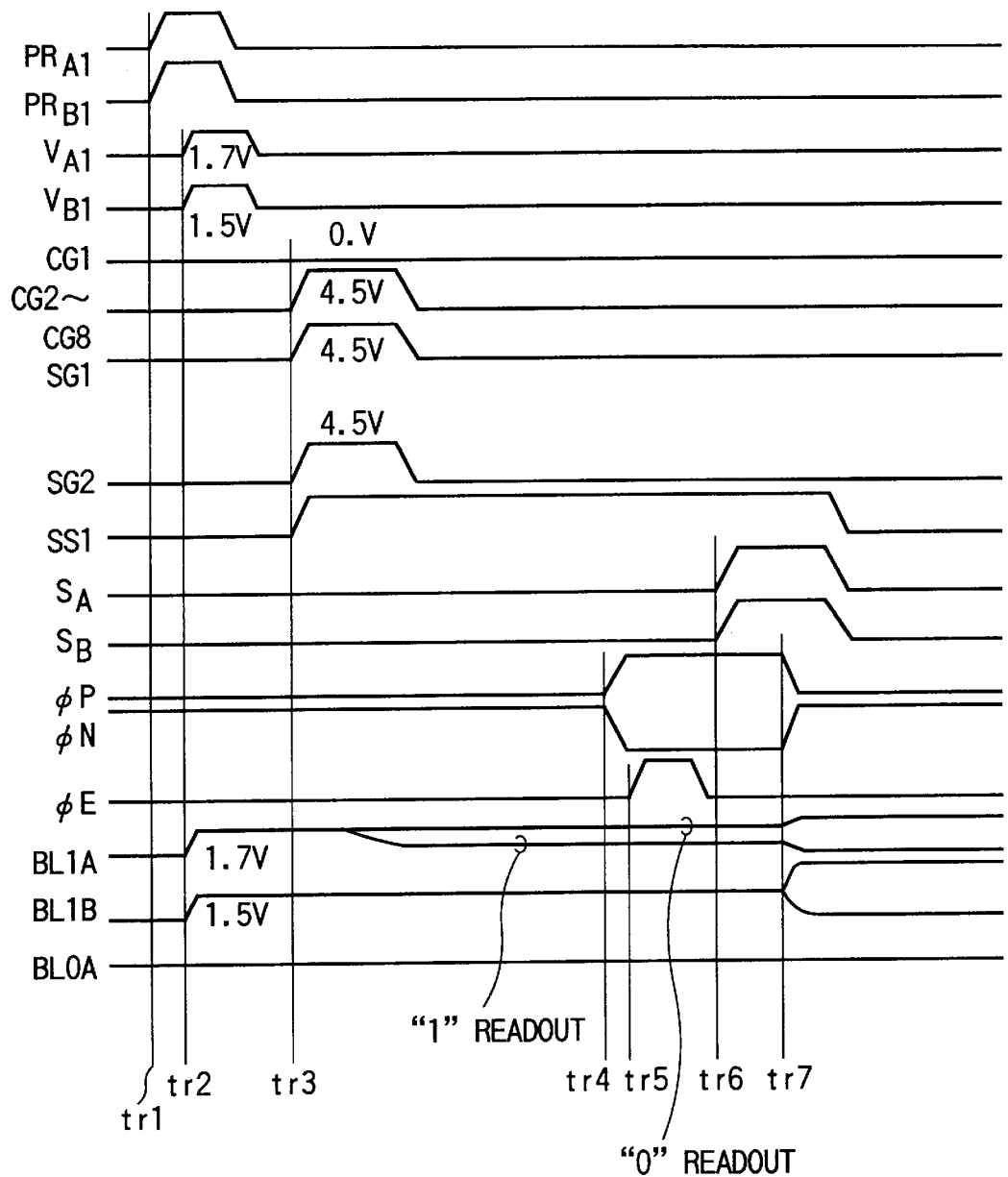
FIG. 20 is a timing chart for explaining a readout operation according to the present invention.

Referring to FIG. 20, an operation of reading data out of the memory cell MC1 shown in FIG. 2.

First, precharge signals $PR_{A1}$ and $PR_{B1}$ are changed from the ground potential to the power supply voltage (time tr1), and bit lines BL1A and BL1B are precharged to voltage $V_{A1}$ (e.g., 1.7V) and voltage $V_{B1}$ (e.g., 1.5V) (time tr2). After the precharge, the precharge signals $PR_{A1}$ and $PR_{B1}$ are both set to the ground voltage, and the bit line BL1A is set in a floating state. After that, a predetermined voltage is applied from a row decoder 3A to the select and control gates (time tr3). A control gate line CG1 is set to 0V and control gate lines CG2 to CG8 are set to 4.5V, and first and second select gate lines SG1 to SG2 are also set to 4.5V. The potentials of the control and select gate lines are potentials boosted from the power supply voltage by the readout booster circuit 12, and applied to the control gate through a word line bias circuit and applied to the select gate through a select gate bias circuit 11.

When data stored in the memory cell MC1 is "0," the threshold voltage of the memory cell is positive and thus no current flows and the potential of the bit line BL1A remains at 1.7V. When data stored in the memory cell MC1 is "1," current flows through the memory cell and thus the potential of the bit line BL1A is decreased to 1.5V. In the meantime, the (dummy) bit line BL1B is maintained at a precharge potential of 1.5V.

After that, at time tr4, a sense amplifier activation signal φP is set to the power supply voltage Vcc and a sense amplifier activation signal φN is set to the ground potential to deactivate a sense amplifier SA1. At time tr5, when an equalize signal φE is set to power supply voltage Vcc, the sense amplifier SA1 is equalized and nodes N1 and N2 are set to Vcc/2 (e.g., 1.5V). At time tr6, sense amplifier select signals $S_A$ and $S_B$ are set to the power supply voltage. After the bit line and sense amplifier are connected to each other, the sense amplifier activation signal φN is set to the power supply voltage and the sense amplifier activation signal φP is set to the ground voltage, a potential difference between the bit lines BL1A and BL1B is amplified, and read data is latched in the sense amplifier SA1 (time tr7).

After that, the level of the column select signal CSL1 becomes high, and the data latched in the sense amplifier SA1 is output through data lines IO and /IO.

Figure 21:
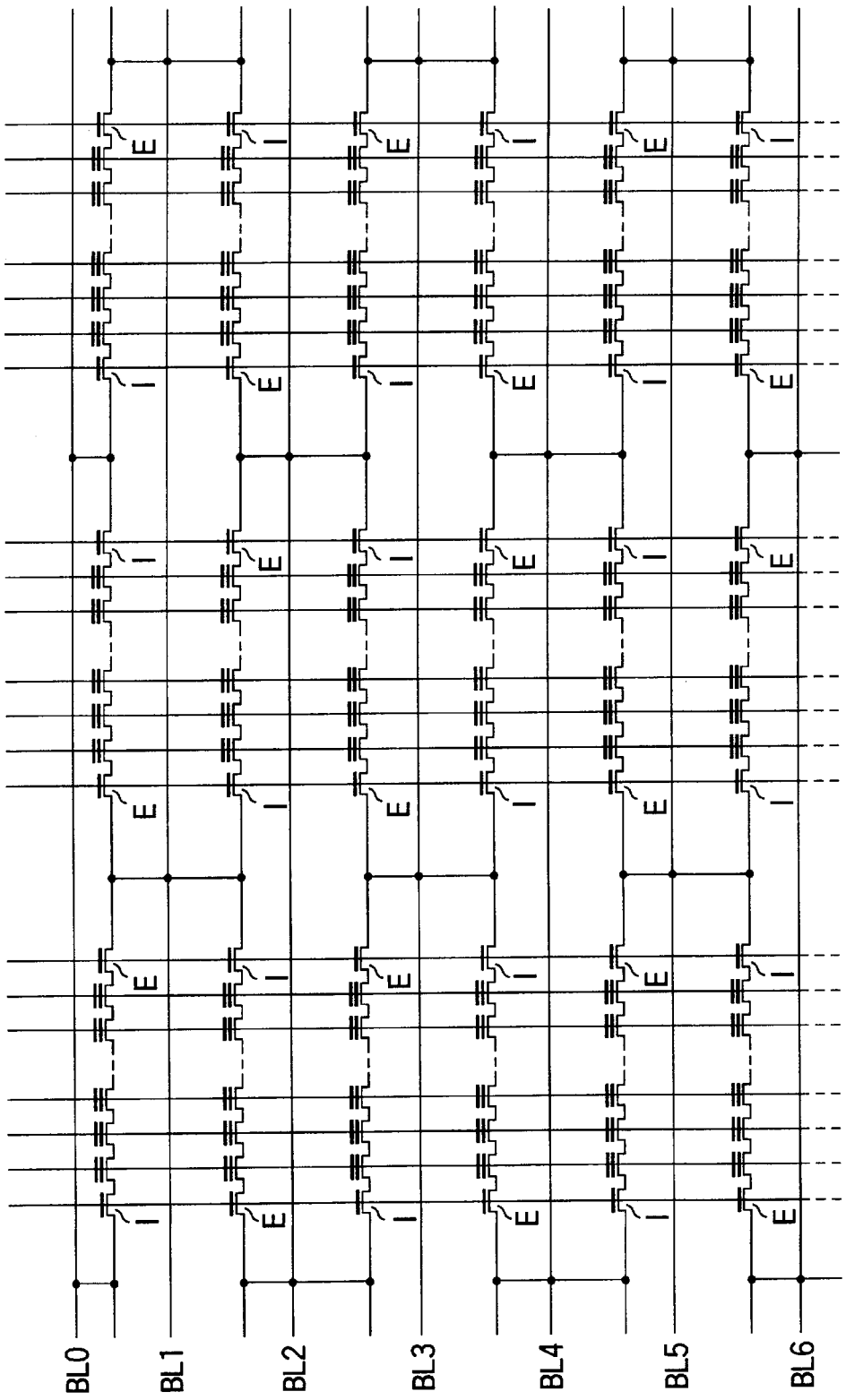
FIG. 21 is a diagram showing another example of a memory cell array of the present invention.
Figure 22:
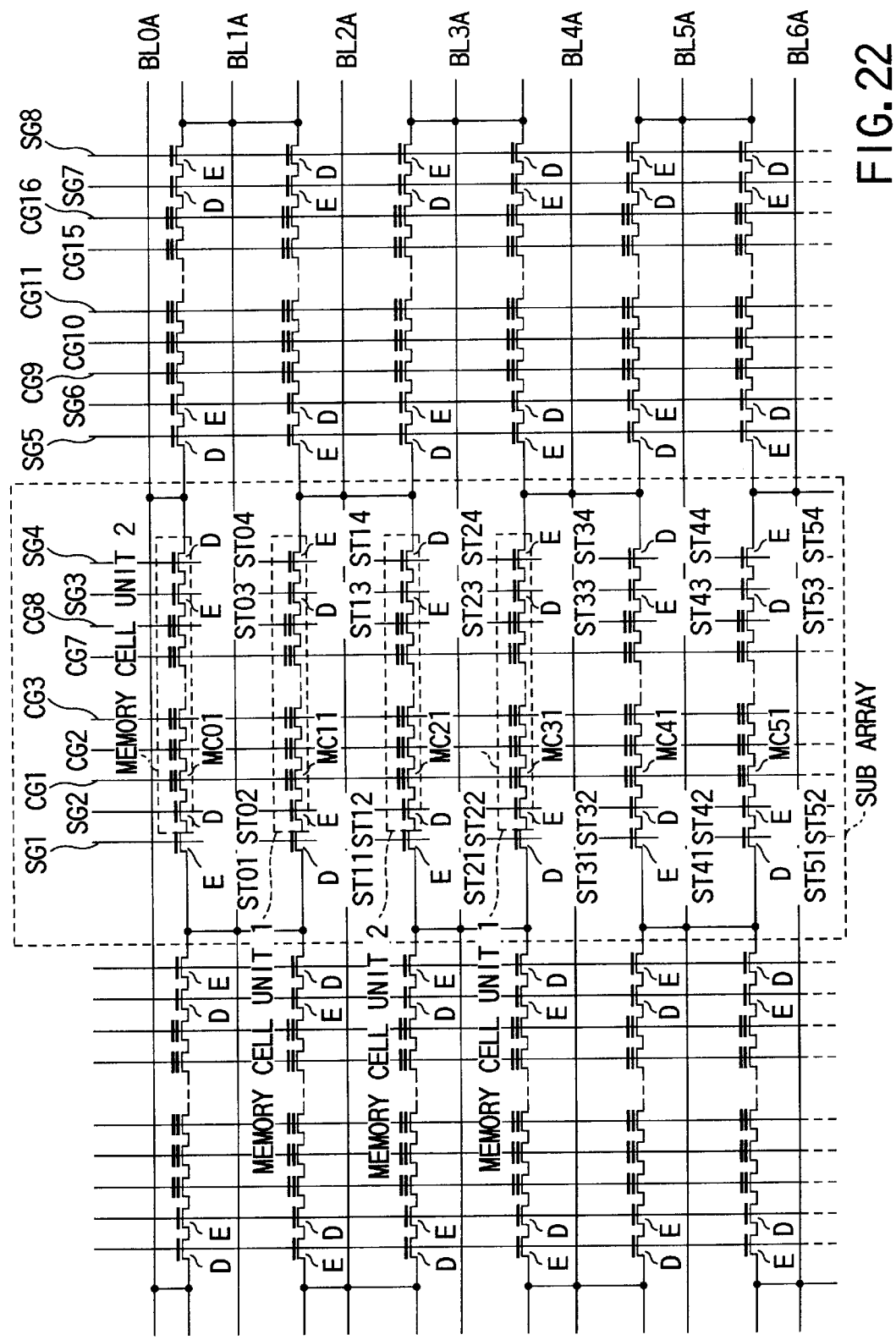
FIG. 22 is a diagram showing still another example of a memory cell array of the present invention.
Figure 23:
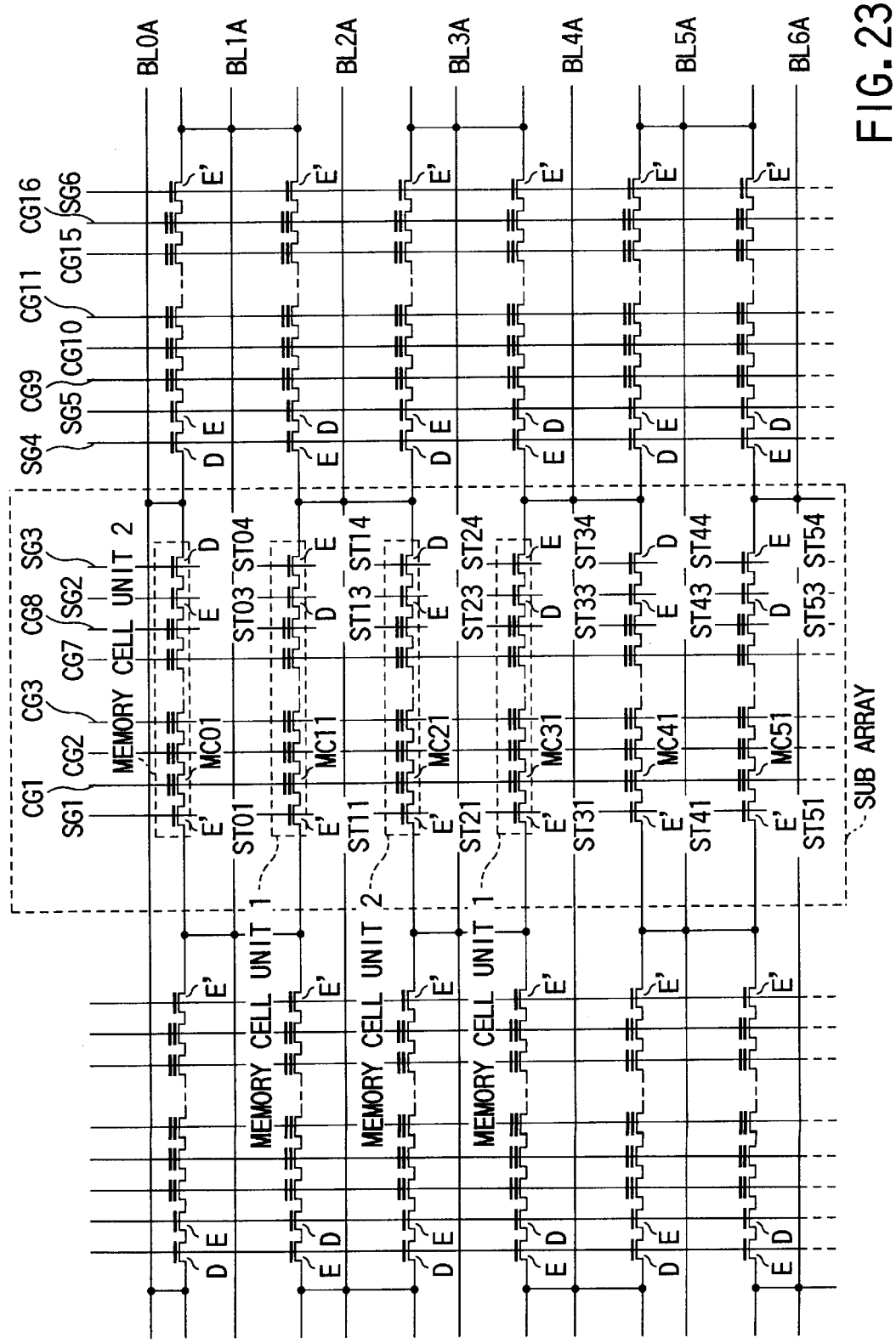
FIG. 23 is a diagram showing yet another example of a memory cell array of the present invention.

The present invention can be applied to the memory cell arrays as illustrated in FIGS. 21 to 23. In the memory cell arrays, a select gate on the source side of each NAND cell is not connected to the source line but to the bit line as a common signal line. The difference between the memory cell arrays shown in FIGS. 21 to 23 is in the number of select gate transistors connected to one NAND cell. The number is two in FIG. 21, four in FIG. 22, and three in FIG. 23. In these figures, E indicates an enhancement type transistor (E type) in which threshold voltage Vth is set larger than 0 and D denotes a depletion type transistor (D type) in which the threshold voltage Vth is set smaller than 0. I represents a transistor in which the threshold voltage is set positive, E' is a transistor in which the threshold voltage is set to one of the D and E types or a different value such as 0.7V.

Figure 24:
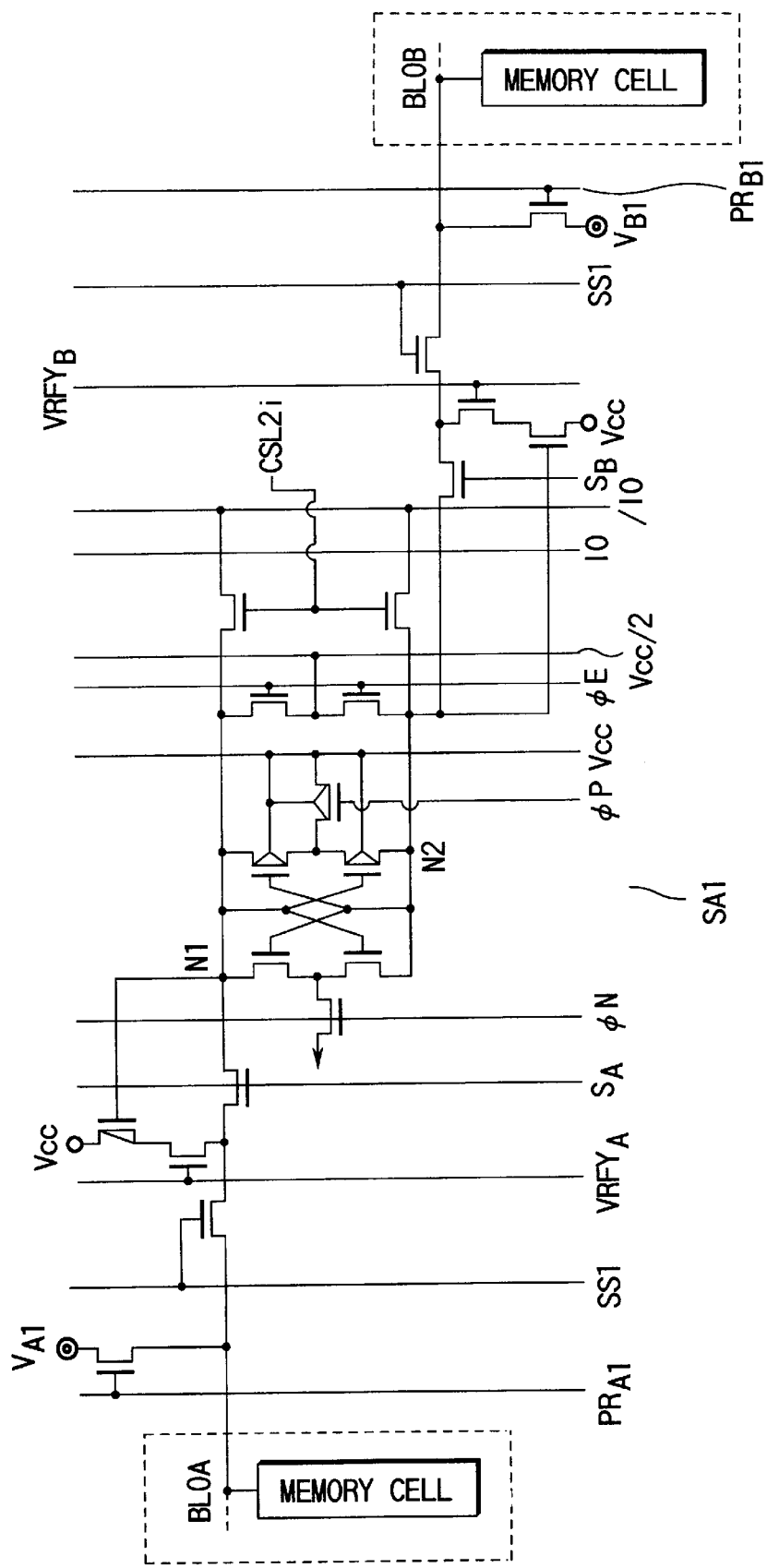
FIG. 24 is a circuit diagram of a sense amplifier circuit applied to the memory cell arrays shown in FIGS. 21, 22 and 23.
Figure 25:
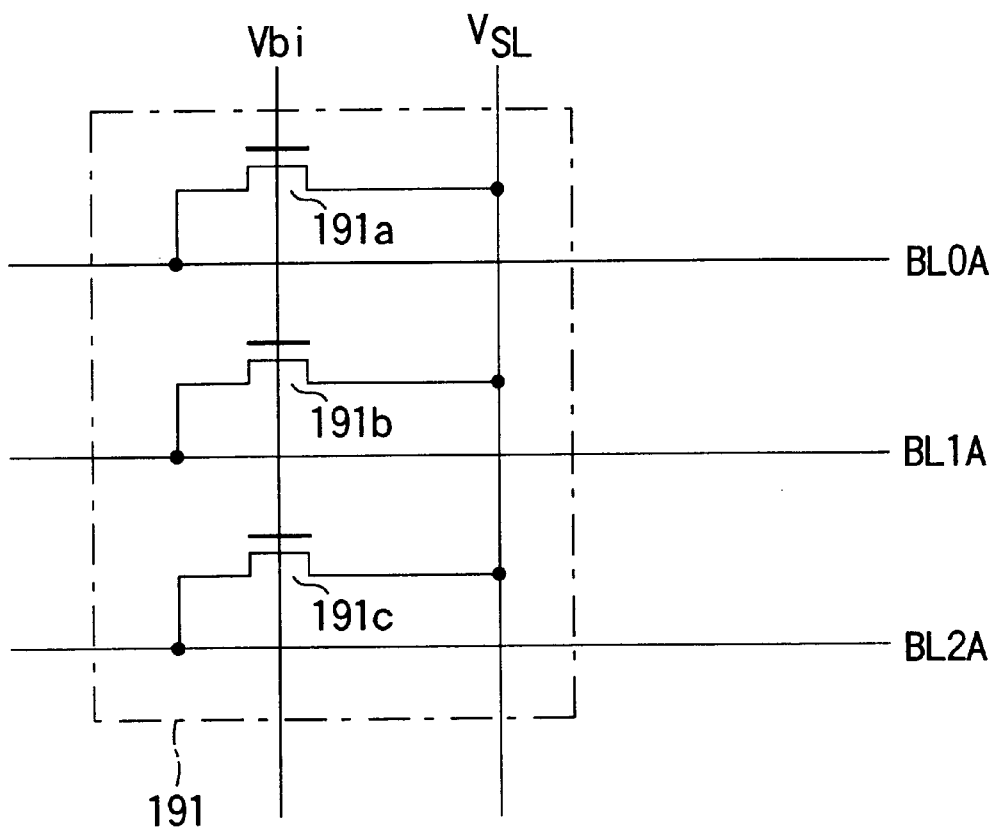
FIG. 25 is a circuit diagram of a source line charging circuit applied to the memory cell arrays shown in FIGS. 21, 22 and 23.
Figure 26A:
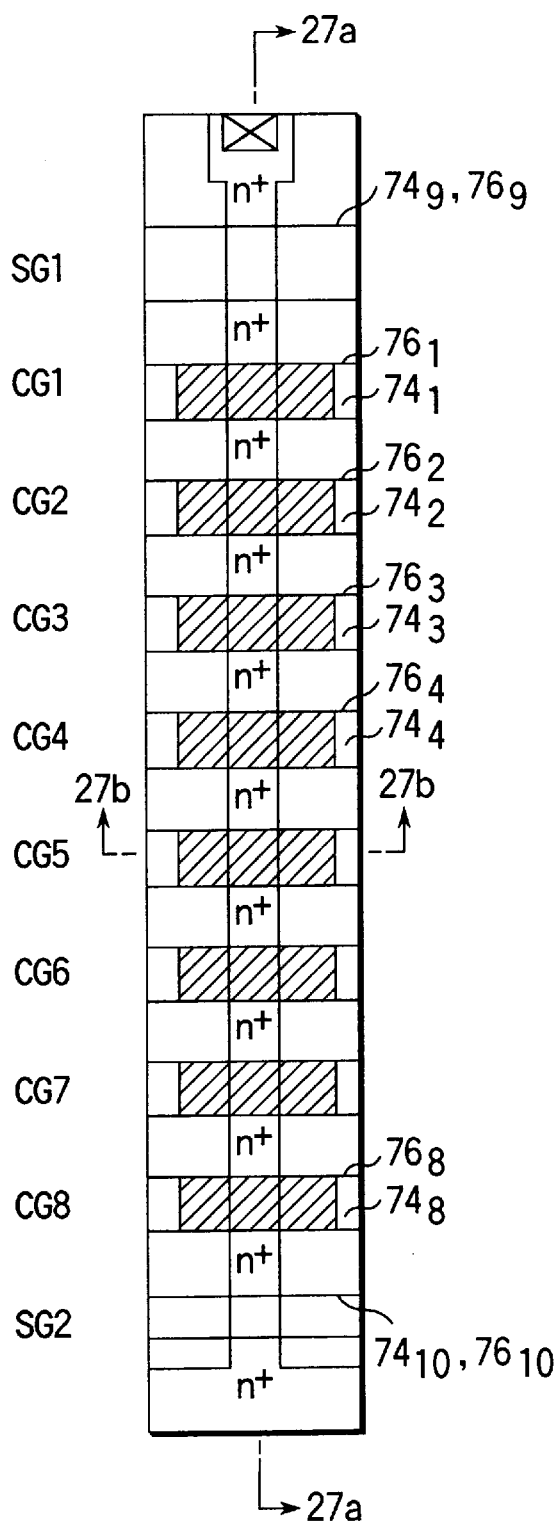
FIG. 26A is a plan view of the cell structure of a NAND cell type EEPROM.
Figure 26B:
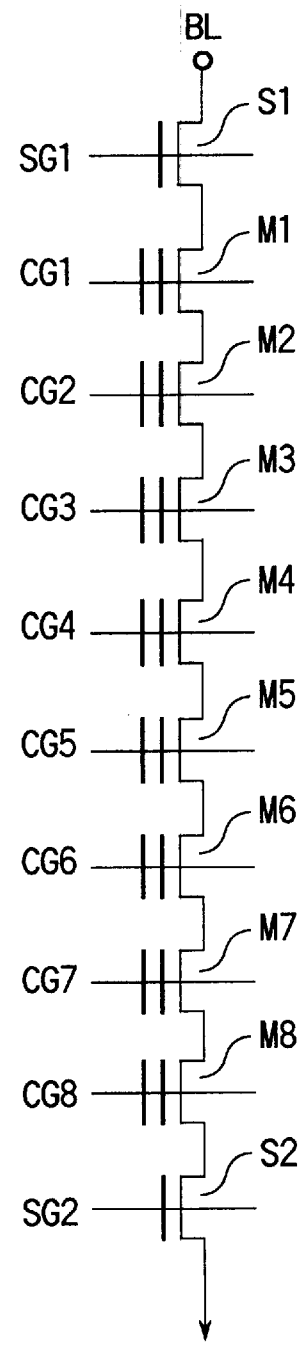
FIG. 26B is an equivalent circuit diagram of FIG. 26A.
Figure 27A:
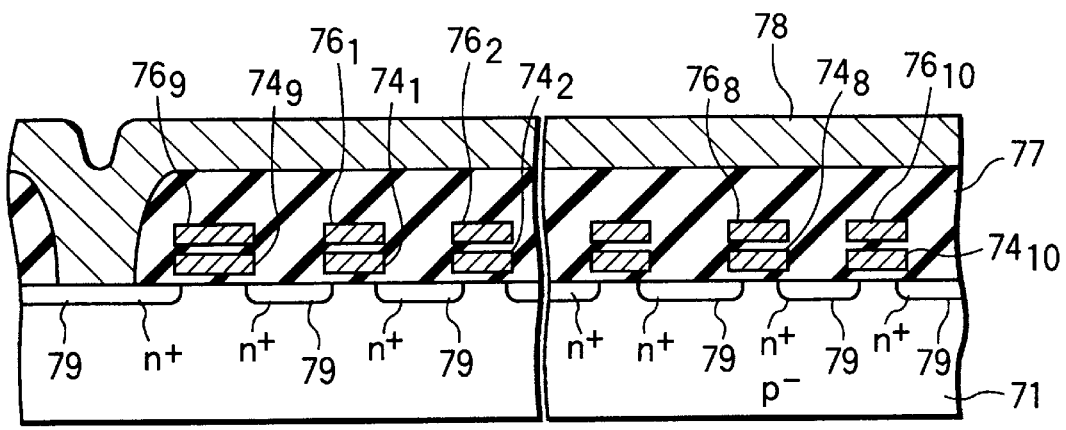
FIG. 27A is a cross-sectional view taken along line 27a—27a of FIG. 26A.
Figure 27B:
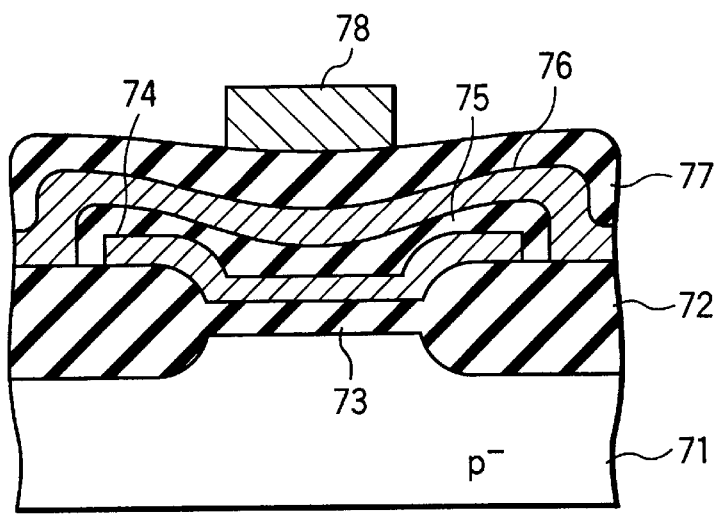
FIG. 27B is a cross-sectional view taken along line 27b—27b of FIG. 26A.
Figure 28:
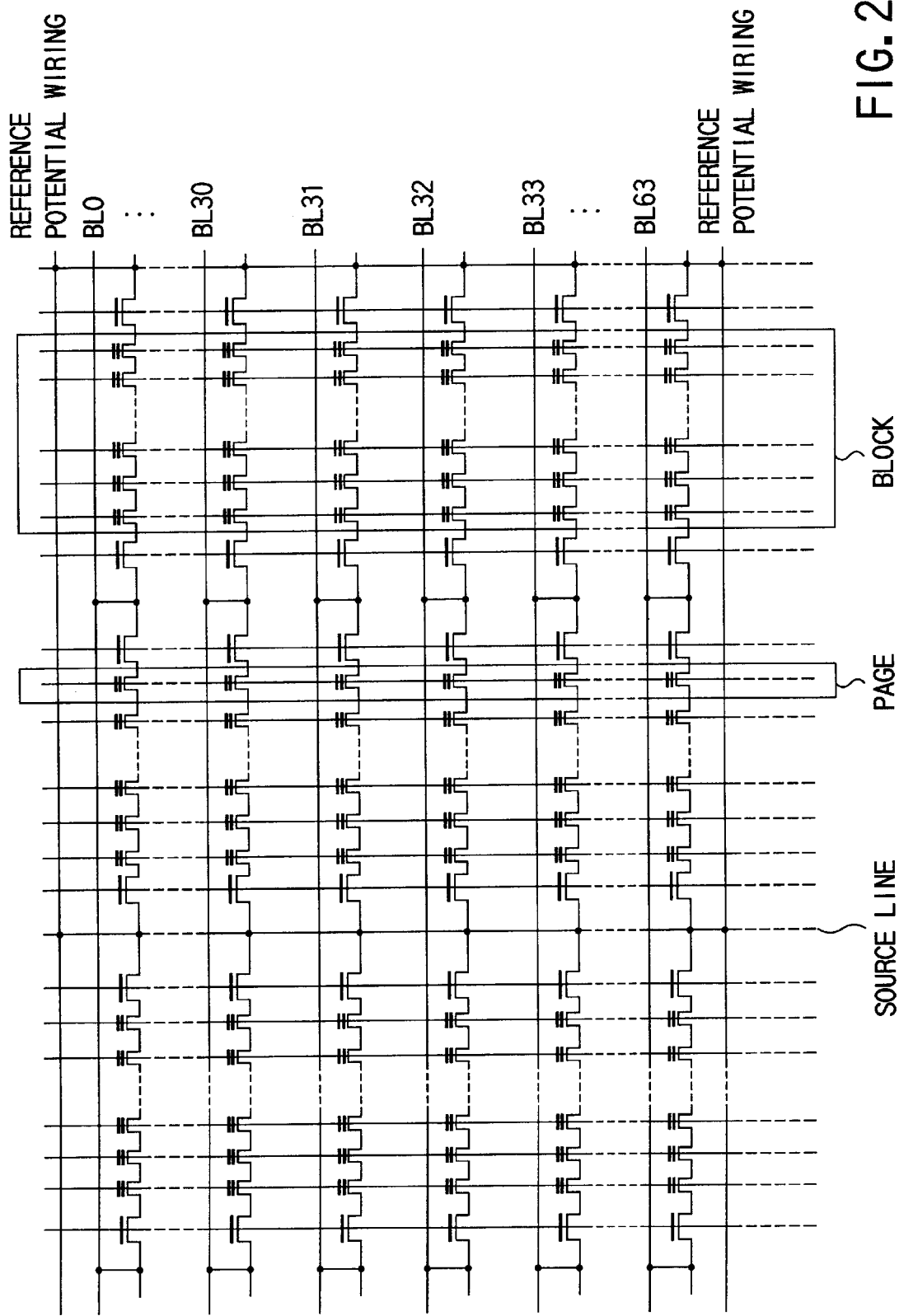
FIG. 28 is a circuit diagram illustrating the memory cell array of the NAND cell type EEPROM.

In each of the above memory cell arrays, common signal lines are connected to their respective ends of each NAND cell, and one of the common signal lines serves as a bit line while the other serves as a source line. In FIGS. 21 to 23, when the common signal line BL01 serves as a bit line, the write non-select potential is applied to the channel of a memory cell through the common signal line BL1A. In such a memory cell array, a sense amplifier is connected to one end of each of the common signal lines BL0A, BL1A, . . . as shown in FIG. 24, and a source line charging circuit 191 can be provided at the other end thereof as shown in FIG. 25. The voltage Vsl output from the source line bias circuit 9 (shown in FIG. 1) is applied to the memory cells through the source line charging circuit 191 and common signal lines BL0A, BL1A, . . . . In order to apply the voltage Vsl to the memory cells without being decreased by the threshold voltage of the transistor, the voltage vbi applied to the gates of transistors 191a, 191b and 191d shown in FIG. 25 has only to be increased to about 6V. Since the sense amplifier shown in FIG. 24 is substantially the same as the circuit shown in FIG. 3, its description is omitted.

In the above embodiments, the present invention is applied to the NAND cell type EEPROM. However, it is not limited to this but can be applied to all memory cell arrays such as those of a NOR type, an AND type (A. Nozoe, ISSCC, Digest of Technical Papers, 1995), a DINOR type (S. Kobayashi, ISSCC, Digest of Technical Papers, 1995), a Virtual Ground Array type (Lee et al., Symposium on VLSI Circuits, Digest of Technical Papers, 1994). Furthermore, the present invention can be applied to not only a flash memory but also a mask ROM, EPROM and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:
   a memory cell section including at least one non-volatile memory cell; and
   a control circuit for applying a write non-select potential from a first end of the memory cell section to the memory cell section, and applying write data from a second end of the memory cell section to the memory cell section thereby to set a desired write state in a selected nonvolatile memory cell of the memory cell section.

2. The apparatus according to claim 1, wherein the write non-select potential is higher than a power supply voltage.

3. A nonvolatile semiconductor memory device comprising:
   a memory cell section including at least one nonvolatile memory cell;
   a first common signal line connected to a first end of the memory cell section;
   a second common signal line connected to a second end of the memory cell section;
   a first voltage apply circuit coupled to the second common signal line; and
   a control circuit for setting the memory cell section in a write non-select state by applying a write non-select potential from the first voltage apply circuit to the memory cell section through the second common signal line, and applying a predetermined voltage from the first common signal line to the memory cell section thereby to set a desired write state in the memory cell section.

4. The device according to claim 3, wherein the control circuit applies a voltage, which is higher than a power supply voltage, to a control gate of the nonvolatile memory cell when the write non-select potential is applied to the memory cell section in a data write mode.

5. The device according to claim 3, wherein the control circuit applies a voltage, which is higher than the write non-select potential at least by a threshold voltage of the nonvolatile memory cell, to a control gate of the nonvolatile memory cell when the write non-select potential is applied to the memory cell section in a data write mode.

6. The device according to claim 3, wherein the write state of the memory cell section is set in accordance with write data to be applied to the first common signal line.

7. The device according to claim 6, wherein when first write data is supplied to the first common signal line, the write non-select state set in the memory cell section is changed to a write select state and, when second write data whose logical level differs from a logical level of the first write data is supplied to the first common signal line, the write non-select state is held in the memory cell section.

8. The device according to claim 7, wherein a level of the second write data is lower than the power supply voltage.

9. The device according to claim 3, wherein the write non-select potential is higher than a power supply voltage.

10. The device according to claim 3, further comprising a bit line control circuit coupled to the first common signal line, for storing data to be written to the nonvolatile memory cell.

11. The device according to claim 3, wherein the first common signal line is a bit line, and the second common signal line is a source line, the source line being shared by a plurality of memory cell sections connected in common to a word line.

12. The device according to claim 3, wherein the memory cell section includes a plurality of nonvolatile memory cells connected in series and said control circuit writes data in sequence from one of the nonvolatile memory cells alongside the first common signal line.

13. The device according to claim 3, further comprising a readout voltage generation circuit for generating a readout voltage to be applied to a control gate of the nonvolatile memory cell in a data read mode.

14. The device according to claim 13, wherein the first voltage apply circuit transfers the readout voltage output from the readout voltage generation circuit, to the second common signal line.

15. The device according to claim 13, wherein the readout voltage generation circuit includes a booster circuit and a limiter circuit for limiting an output voltage of the booster circuit to a predetermined voltage, the limiter circuit setting the output voltage to different potentials in data write and read modes.

16. The device according to claim 3, wherein a write select state in which charge is discharged from or charged into the memory cell section of the write non-select state forms a first write state, and a state in which the write non-select state is held in the memory cell section forms a second write state.

17. A nonvolatile semiconductor memory device comprising:
   a memory cell section including at least one nonvolatile memory cell;
   a first common signal line connected to a first end of the memory cell section;
   a second common signal line connected to a second end of the memory cell section;
   a first select gate arranged between the first common signal line and the memory cell section;

a second select gate arranged between the second common signal line and the memory cell section;

a first voltage apply circuit coupled to the second common signal line; and a control circuit for turning off the first select gate and turning on the second select gate to set the memory cell section in a write non-select state by applying a write non-select potential from the first voltage apply circuit to the memory cell section through the second common signal line, and turning off the second select gate to set a desired write state in the memory cell section based on write data transferred to the first common signal line.

18. The device according to claim 17, wherein the control circuit applies a voltage, which is higher than a power supply voltage, to the second select gate when the write non-select potential is applied to the memory cell section in a data write mode.

19. The device according to claim 17, wherein the control circuit applies a voltage, which is higher than the write non-select potential at least by a threshold voltage of the second select gate, to the second select gate when the write non-select potential is applied to the memory cell section in a data write mode.

20. The device according to claim 17, wherein the control circuit applies a voltage, which is higher than a power supply voltage, to a control gate of the nonvolatile memory cell when the write non-select potential is applied to the memory cell section in a data write mode.

21. The device according to claim 17, wherein the control circuit applies a voltage, which is higher than the write non-select potential at least by a threshold voltage of the nonvolatile memory cell, to a control gate of the nonvolatile memory cell when the write non-select potential is applied to the memory cell section in a data write mode.

22. The device according to claim 17, wherein the write state of the memory cell section is set in accordance with write data to be applied to the first common signal line.

23. The device according to claim 22, wherein when first write data is transferred to the first common signal line, the first select gate is turned on to discharge from the memory cell section of the write non-select state, to the first common signal line through the turned-on first select gate and change the write non-select state to a write select state and, when second write data whose level differs from a level of the first write data is transferred to the first common signal line, the first select gate is turned off to hold the write non-select state in the memory cell section.

24. The device according to claim 23, wherein the level of the second write data is lower than the power supply voltage.

25. The device according to claim 17, wherein the write non-select potential is higher than a power supply voltage.

26. The device according to claim 17, further comprising a bit line control circuit coupled to the first common signal line, for storing data to be written to the nonvolatile memory cell.

27. The device according to claim 17, wherein the first common signal line is a bit line, and the second common signal line is a source line, the source line being shared by a plurality of memory cell sections connected in common to a word line.

28. The device according to claim 17, wherein the memory cell section includes a plurality of nonvolatile memory cells connected in series and said control circuit writes data in sequence from one of the nonvolatile memory cells alongside the first common signal line.

29. The device according to claim 17, further comprising a readout voltage generation circuit for generating a readout voltage to be applied to a control gate of the nonvolatile memory cell in a data read mode.

30. The device according to claim 29, wherein the first voltage apply circuit transfers the readout voltage output from the readout voltage generation circuit, to the second common signal line.

31. The device according to claim 29, wherein the readout voltage generation circuit includes a booster circuit and a limiter circuit for limiting an output voltage of the booster circuit to a predetermined voltage, the limiter circuit setting the output voltage to different potentials in data write and read modes.

32. The device according to claim 17, wherein a write select state in which charge is discharged from or charged into the memory cell section of the write non-select state forms a first write state, and a state in which the write non-select state is held in the memory cell section forms a second write state.

33. The device according to claim 17, wherein in a data write mode, the control circuit causes the first voltage apply circuit to apply the write non-select potential to the second common signal line and the second select gate, the control circuit causes a second voltage apply circuit to apply a voltage to a control gate of the nonvolatile memory cell to generate a write inhibit voltage boosted by capacitance coupling of a channel of the nonvolatile memory cell with the control gate thereof, the control circuit sets the second select gate to a ground potential, and the control circuit applies a first select gate voltage to the first select gate.

34. The device according to claim 33, wherein the first select gate voltage is a power supply voltage.

35. The device according to claim 17, wherein in a data write mode, the control circuit causes the first voltage apply circuit to apply the write non-select potential to the second common signal line and the second select gate, the control circuit causes a second voltage apply circuit to apply a voltage to a control gate of the nonvolatile memory cell to generate a write inhibit voltage boosted by capacitance coupling of a channel of the nonvolatile memory cell with the control gate thereof, the control circuit sets the second select gate to a ground potential, and the control circuit decreases the second common signal line from the write non-select potential to a power supply voltage.

36. The device according to claim 35, wherein the first select gate voltage is a power supply voltage.

37. The device according to claim 17, wherein in a data write mode, the control circuit causes the first voltage apply circuit to apply the write non-select potential to the second common signal line and the second select gate and causes a second voltage apply circuit to apply the write non-select potential to a control gate of the nonvolatile memory cell, then causes the second voltage apply circuit to apply a voltage to the control gate of the nonvolatile memory cell to generate a write inhibit voltage boosted by capacitance coupling of a channel of the nonvolatile memory cell with the control gate thereof, sets the second select gate to a ground voltage, and applies a first select gate voltage to the first select gate.

38. The device according to claim 37, wherein the first select gate voltage is a power supply voltage.

39. A nonvolatile semiconductor memory device comprising:

a memory cell section including at least one nonvolatile memory cell;

a first common signal line connected to a first end of the memory cell section;

a second common signal line connected to a second end of the memory cell section;

a first voltage apply circuit coupled to the second common signal line, for applying a write non-select potential to the second common signal line;

a first select gate for connecting the first end of the memory cell section to the first common signal line;

a second select gate for connecting the second end of the memory cell section to the second common signal line;

a second voltage apply circuit for applying a predetermined voltage to the first select gate, the second select gate, and a control gate of the nonvolatile memory cell; and a control circuit for, in a data write mode, causing the first voltage apply circuit to apply the write non-select potential to the memory cell section and causing the second voltage apply circuit to apply a ground potential to the first select gate, to apply a voltage, which is higher than the write non-select potential at least by a threshold voltage of the nonvolatile memory cell, to the control gate of the nonvolatile memory cell, to apply a voltage, which is higher than the write non-select potential at least by a threshold voltage of the second select gate, to the second select gate, then, to apply the ground potential to the second select gate to set the memory cell section in a write non-select state, and then to apply a first select gate voltage to the first select gate to set a desired write state in the memory cell section.

40. The device according to claim 39, wherein the first select gate voltage is a power supply voltage.

41. The device according to claim 39, wherein the control circuit causes the first voltage apply circuit to apply the write non-select potential to the memory cell section and then causes the second voltage apply circuit to apply a voltage to the control gate of the nonvolatile memory cell to generate a write inhibit voltage boosted by capacitance coupling of a channel of the nonvolatile memory cell with the control gate thereof.

42. The device according to claim 41, wherein the second voltage apply circuit applies a voltage for generating the write inhibit voltage to the control gate of the nonvolatile memory cell and then applies a first select gate voltage to the first select gate.

43. The device according to claim 41, wherein the second voltage apply circuit applies a first select gate voltage to the first select gate and then applies a voltage for generating the write inhibit voltage to the control gate of the nonvolatile memory cell.

44. The device according to claim 39, wherein the write state of the memory cell section is set in accordance with write data to be applied to the first common signal line.

45. The device according to claim 44, wherein when first write data is transferred to the first common signal line, the first select gate is turned on to discharge from the memory cell section of the write non-select state, to the first common signal line through the turned-on first select gate and change the write non-select state to a write select state and, when second write data whose level differs from a level of the first write data is transferred to the first common signal line, the first select gate is turned off to hold the write non-select state in the memory cell section.

46. The device according to claim 45, wherein the level of the second write data is lower than the power supply voltage.

47. The device according to claim 39, wherein the write non-select potential is higher than a power supply voltage.

48. The device according to claim 39, further comprising a bit line control circuit coupled to the first common signal line, for storing data to be written to the nonvolatile memory cell.

49. The device according to claim 39, wherein the first common signal line is a bit line, and the second common signal line is a source line, the source line being shared by a plurality of memory cell sections connected in common to a word line.

50. The device according to claim 37, wherein the memory cell section includes a plurality of nonvolatile memory cells connected in series and said control circuit writes data in sequence from one of the nonvolatile memory cells alongside the first common signal line.

51. The device according to claim 39, further comprising a readout voltage generation circuit for generating a readout voltage to be applied to a control gate of the nonvolatile memory cell in a data read mode.

52. The device according to claim 51, wherein the first voltage apply circuit transfers the readout voltage output from the readout voltage generation circuit, to the second common signal line.

53. The device according to claim 51, wherein the readout voltage generation circuit includes a booster circuit and a limiter circuit for limiting an output voltage of the booster circuit to a predetermined voltage, the limiter circuit setting the output voltage to different potentials in data write and read modes.

54. The device according to claim 39, wherein a write select state in which charge is discharged from or charged into the memory cell section of the write non-select state forms a first write state, and a state in which the write non-select state is held in the memory cell section forms a second write state.

55. A nonvolatile semiconductor memory device X comprising:

a memory cell section including at least one nonvolatile memory cell;

a first common signal line connected to a first end of the memory cell section;

a second common signal line connected to a second end of the memory cell section;

a first select gate for connecting the first end of the memory cell section to the first common signal line;

a second select gate for connecting the second end of the memory cell section to the second common signal line;

a first voltage apply circuit coupled to the second common signal line and the second select gate, for applying a write non-select potential to the second common signal line and the second select gate;

a second voltage apply circuit for applying a predetermined voltage to the first select gate and a control gate of the nonvolatile memory cell; and a control circuit for, in a data write mode, causing the first voltage apply circuit to apply a ground potential to the first select gate and the control gate of the nonvolatile memory cell, to apply the write non-select potential to the second select gate and the second common signal line to set the memory cell section in a write non-select state, then, to apply the ground potential to the second select gate, and causing the second voltage apply circuit to apply a first select gate voltage to the first select gate to set a desired write state in the memory cell section.

56. The device according to claim 55, wherein the first select gate voltage is a power supply voltage.

57. The device according to claim 55, wherein the control circuit causes the first voltage apply circuit to apply the write non-select potential to the second select gate and the second common signal line and then causes the second voltage apply circuit to apply a voltage to the control gate of the nonvolatile memory cell to generate a write inhibit voltage boosted by capacitance coupling of a channel of the nonvolatile memory cell with the control gate thereof.

58. The device according to claim 57, wherein the second voltage apply circuit applies a voltage for generating the write inhibit voltage to the control gate of the nonvolatile memory cell and then applies a first select gate voltage to the first select gate.

59. The device according to claim 57, wherein the second voltage apply circuit applies a first select gate voltage to the first select gate and then applies a voltage for generating the write inhibit voltage to the control gate of the nonvolatile memory cell.

60. The device according to claim 55, wherein the write state of the memory cell section is set in accordance with write data to be applied to the first common signal line.

61. The device according to claim 60, wherein when first write data is transferred to the first common signal line, the first select gate is turned on to discharge from the memory cell section of the write non-select state, to the first common signal line through the turned-on first select gate and change the write non-select state to a write select state and, when second write data whose logical level differs from a logical level of the first write data is transferred to the first common signal line, the first select gate is turned off to hold the write non-select state in the memory cell section.

62. The device according to claim 55, wherein a write select state in which charge is discharged from or charged into the memory cell section of the write non-select state forms a first write state, and a state in which the write non-select state is held in the memory cell section forms a second write state.

63. The device according to claim 55, wherein the write non-select potential is higher than a power supply voltage.

64. The device according to claim 55, further comprising a bit line control circuit coupled to the first common signal line, for storing data to be written to the nonvolatile memory cell.

65. The device according to claim 55, wherein the first common signal line is a bit line, and the second common signal line is a source line, the source line being shared by a plurality of memory cell sections connected in common to a word line.

66. The device according to claim 55, wherein the memory cell section includes a plurality of nonvolatile memory cells connected in series and said control circuit writes data in sequence from one of the nonvolatile memory cells alongside the first common signal line.

67. The device according to claim 55, further comprising a readout voltage generation circuit for generating a readout voltage to be applied to a control gate of the nonvolatile memory cell in a data read mode.

68. The device according to claim 67, wherein the first voltage apply circuit transfers the readout voltage output from the readout voltage generation circuit, to the second common signal line.

69. The device according to claim 67, wherein the readout voltage generation circuit includes a booster circuit and a limiter circuit for limiting an output voltage of the booster circuit to a predetermined voltage, the limiter circuit setting the output voltage to different potentials in data write and read modes.

70. The device according to claim 61, wherein the level of the second write data is lower than the power supply voltage.

71. A nonvolatile semiconductor memory device comprising:
a memory cell section including at least one nonvolatile memory cell;
a common signal line connected to one end of the memory cell section; and
a control circuit for supplying write data, having a maximum value lower than a power supply voltage, to the common signal line and setting a desired write state in a selected nonvolatile memory cell of the memory cell section.

72. The device according to claim 71, wherein when a ground potential is applied to the common signal line, the memory cell section is set in a write select state and, when a voltage, which is higher than the ground potential and lower than the power supply voltage, is applied to the common signal line, the memory cell section is set in a write non-select state.

73. The device according to claim 71, wherein the first common signal line is a bit line.

74. The device according to claim 71, wherein the memory cell section includes a plurality of nonvolatile memory cells connected in series.

75. A nonvolatile semiconductor memory device comprising:
a memory cell section including at least one nonvolatile memory cell;
a first common signal line connected to a first end of the memory cell section;
a second common signal line connected to a second end of the memory cell section;
a first select gate arranged between the first common signal line and the memory cell section;
a second select gate arranged between the second common signal line and the memory cell section;
a first voltage apply circuit coupled to the second common signal line; and
a control circuit for turning off the first select gate and turning on the second select gate to set the memory cell section in a write non-select state by applying a write non-select potential from the first voltage apply circuit to the memory cell section through the second common signal line, subsequently turning off the second select gate and turning on the first select gate to set the memory cell section in a desired write state based on write data transferred to the first common signal line.

76. The device according to claim 75, wherein said control circuit applies a ground potential from the first voltage apply circuit to the second common signal line, subsequent to the desired write state.

77. The device according to claim 75, wherein said control circuit applies a ground potential to a control gate of the nonvolatile memory cell when the write non-select potential is applied to the memory cell section in a data write mode.

78. The device according to claim 75, wherein said memory cell section includes a plurality of nonvolatile memory cells connected in series, and said control circuit applies a pass voltage to a control gate of a non-selected nonvolatile memory cell and applies a program voltage that is higher than the pass voltage to a selected nonvolatile memory cell when the write non-select potential is applied through the second common signal line to the memory cell section in a data write mode.

79. The device according to claim 75, wherein said write non-select potential is higher than the power supply voltage.

80. The device according to claim 75, wherein said first common signal line is a bit line, and the second common signal line is a source line, the source line being shared by a plurality of memory cell sections connected in common to a word line.

* * * * *

UNITED STATES PATENT AND TRADEMARK OFFICE
CERTIFICATE OF CORRECTION

PATENT NO. : 6,134,157
DATED : October 17, 2000
INVENTOR(S) : Ken Takeuchi

It is certified that error appears in the above-identified patent and that said Letters Patent is hereby corrected as shown below:

Title page,
References Cited [56],
-- OTHER DOCUMENTS
Kang-Deog SUH et al, "A 3.3V 32 Mb NAND Flash Memory with Incremental Step Pulse Programming Scheme" IEEE Journal of Solid-State Circuits, Vol. 30, No. 11, November 1995;, 8 pages -- has been inserted.

Claim 50, column 22,
Line 6, "37" has been replaced with -- 39 --.

Claim 55, column 22,
Line 31, "X" has been deleted.

Claim 73, column 24,
Line 13, "first" has been deleted.

Signed and Sealed this

Twenty-third Day of October, 2001

Attest:

NICHOLAS P. GODICI
Attesting Officer
Acting Director of the United States Patent and Trademark Office